US011004731B2

(12) United States Patent
Miyano

(10) Patent No.: US 11,004,731 B2
(45) Date of Patent: May 11, 2021

(54) SEMICONDUCTOR DEVICE

(71) Applicant: Toshiba Memory Corporation, Tokyo (JP)

(72) Inventor: Yumiko Miyano, Shinagawa Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 32 days.

(21) Appl. No.: 16/135,686

(22) Filed: Sep. 19, 2018

(65) Prior Publication Data
US 2019/0019723 A1 Jan. 17, 2019

Related U.S. Application Data

(63) Continuation of application No. 15/444,264, filed on Feb. 27, 2017, now Pat. No. 10,115,627.

(30) Foreign Application Priority Data

Aug. 31, 2016 (JP) ................. 2016-169208

(51) Int. Cl.
*H01L 27/1157* (2017.01)
*H01L 21/768* (2006.01)
(Continued)

(52) U.S. Cl.
CPC .. *H01L 21/76816* (2013.01); *H01L 21/76877* (2013.01); *H01L 23/5226* (2013.01);
(Continued)

(58) Field of Classification Search
CPC ......... H01L 21/76816; H01L 21/76877; H01L 23/5283; H01L 27/11582; H01L 27/1157; H01L 23/5226
See application file for complete search history.

(56) References Cited

U.S. PATENT DOCUMENTS 6,713,830 B2  3/2004 Nishimura et al.
7,936,004 B2  5/2011 Kito et al.
(Continued)

FOREIGN PATENT DOCUMENTS

JP  2007-266143 A  10/2007
JP  2010-098235 A  4/2010
(Continued)

OTHER PUBLICATIONS

Japanese Application No. 2016-052690, filed on Mar. 16, 2016 (with English translation).

*Primary Examiner* — Jarrett J Stark
(74) *Attorney, Agent, or Firm* — Kim & Stewart LLP

(57) ABSTRACT

According to one embodiment, a semiconductor device includes a base, a memory cell region on the base comprising a first plurality of conductive layers and a second plurality of insulating layers, wherein an insulating layer extends between, and separates, each two adjacent conductive layers of the first plurality of conductive layers. A first stacked body and a second stacked body are located on the base, and includes a plurality of insulating layers and a plurality of conductive layers fewer than the number of first conductive layers, and an insulating layer extends between, and separates, each two adjacent conductive layers of the plurality of conductive layers in each stacked body. The end portions of the stacked bodies include a stair portion having a stair-like shape wherein a surface of each of the conductive layers thereof is exposed.

12 Claims, 15 Drawing Sheets

(51) Int. Cl.
  *H01L 27/11575* (2017.01)
  *H01L 23/522* (2006.01)
  *H01L 23/528* (2006.01)
  *H01L 27/11582* (2017.01)

(52) U.S. Cl.
  CPC ...... *H01L 23/5283* (2013.01); *H01L 27/1157* (2013.01); *H01L 27/11575* (2013.01); *H01L 27/11582* (2013.01)

(56) References Cited

U.S. PATENT DOCUMENTS

| | | | |
|---|---|---|---|
| 8,207,565 B2 | 6/2012 | Sato | |
| 8,237,211 B2 | 8/2012 | Fukuzumi et al. | |
| 8,338,956 B2 | 12/2012 | Maeda | |
| 8,759,217 B1* | 6/2014 | Chen | H01L 21/76838 438/689 |
| 9,130,054 B2 | 9/2015 | Jang et al. | |
| 9,202,570 B2* | 12/2015 | Hwang | H01L 27/11556 |
| 9,449,987 B1* | 9/2016 | Miyata | H01L 27/11582 |
| 9,455,268 B2* | 9/2016 | Oh | H01L 27/2481 |
| 9,576,967 B1* | 2/2017 | Kimura | H01L 27/11582 |
| 9,627,403 B2* | 4/2017 | Liu | H01L 27/11573 |
| 9,691,786 B1* | 6/2017 | Tsuji | H01L 27/11582 |
| 9,806,093 B2* | 10/2017 | Toyama | H01L 27/11524 |
| 10,008,570 B2* | 6/2018 | Yu | H01L 27/11565 |
| 10,381,362 B1* | 8/2019 | Cui | H01L 21/76898 |
| 10,559,592 B1* | 2/2020 | Liu | H01L 21/76877 |
| 2010/0013049 A1* | 1/2010 | Tanaka | H01L 21/76816 257/532 |
| 2010/0052042 A1* | 3/2010 | Tanaka | H01L 27/11551 257/324 |
| 2010/0109071 A1* | 5/2010 | Tanaka | H01L 27/11578 257/324 |
| 2010/0181610 A1* | 7/2010 | Kim | H01L 27/11578 257/314 |
| 2011/0108907 A1* | 5/2011 | Maeda | H01L 27/11573 257/324 |
| 2014/0061776 A1* | 3/2014 | Kwon | H01L 21/8239 257/329 |
| 2014/0162420 A1* | 6/2014 | Oh | H01L 27/11565 438/270 |
| 2014/0191388 A1* | 7/2014 | Chen | H01L 27/11548 257/734 |
| 2014/0339621 A1* | 11/2014 | Simsek-Ege | H01L 29/66825 257/316 |
| 2015/0069616 A1* | 3/2015 | Oh | H01L 23/48 257/773 |
| 2015/0236038 A1* | 8/2015 | Pachamuthu | H01L 27/11582 257/326 |
| 2015/0325587 A1* | 11/2015 | Chen | H01L 21/76877 257/314 |
| 2016/0133638 A1* | 5/2016 | Simsek-Ege | H01L 27/1157 257/314 |
| 2016/0322381 A1* | 11/2016 | Liu | H01L 27/11573 |
| 2017/0077139 A1* | 3/2017 | Iguchi | H01L 27/11582 |
| 2017/0179153 A1* | 6/2017 | Ogawa | H01L 27/11524 |
| 2017/0263556 A1* | 9/2017 | Tessariol | H01L 21/76877 |
| 2017/0278860 A1* | 9/2017 | Aoyama | H01L 27/11582 |
| 2017/0309634 A1* | 10/2017 | Noguchi | H01L 27/11519 |
| 2020/0083059 A1* | 3/2020 | Hopkins | H01L 27/11556 |

FOREIGN PATENT DOCUMENTS

| | | |
|---|---|---|
| JP | 2011-014666 A | 1/2011 |
| JP | 2011-100921 A | 5/2011 |
| JP | 2014-033201 A | 2/2014 |
| JP | 2015-230909 A | 12/2015 |

* cited by examiner

SEMICONDUCTOR DEVICE

CROSS-REFERENCE TO RELATED APPLICATIONS

This application is a continuation of U.S. patent application Ser. No. 15/444,264, filed on Feb. 27, 2017, which is based upon and claims the benefit of priority from Japanese Patent Application No. 2016-169208, filed on Aug. 31, 2016, the entire contents of each of which are incorporated herein by reference.

FIELD

Embodiments described herein relate generally to a semiconductor device.

BACKGROUND

There is known a technique to three-dimensionally array memory cells by forming a memory hole in a stacked body having conductive layers and insulating layers stacked one over the other, wherein each of the conductive layers function as a control gate in a memory device, forming a charge storage layer on an inner wall of the memory hole, and then providing silicon inside the memory hole.

DETAILED DESCRIPTION

Figure 1:
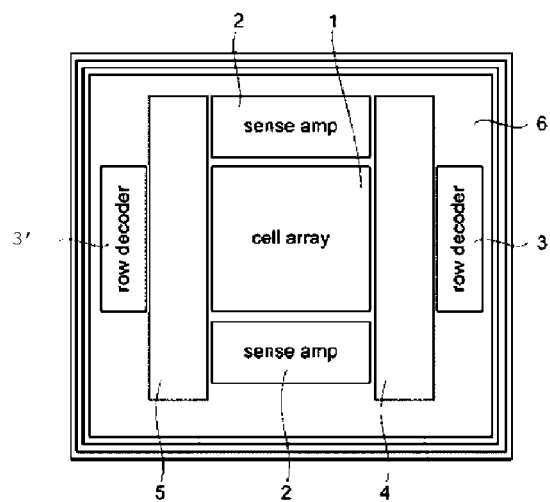
FIG. 1 is a schematic view illustrating a planar layout of principal elements of a semiconductor device according to a first embodiment.
Figure 1:
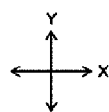

An embodiment provides a semiconductor device in which the height of a stair portion of a contact region is controlled.

In general, according to one embodiment, a semiconductor device includes a base, a memory cell region on the base comprising a first plurality of conductive layers and a second plurality of insulating layers, wherein an insulating layer extends between, and separates, each two adjacent conductive layers of the first plurality of conductive layers. A first stacked body is located on the base and includes a second plurality of insulating layers and a second plurality of conductive layers fewer than the number of first conductive layers, and an insulating layer extends between, and separates, each two adjacent conductive layers of the second plurality of conductive layers, and the end portion of the first stacked body includes a first stair portion having a first stair-like shape wherein a surface of each of the second plurality of conductive layers is exposed, and a second stacked body is located on the base and includes a plurality of insulating layers and a third plurality of conductive layers fewer in number than the first plurality of conductive layers, and an insulating layer extends between, and separates, each two adjacent conductive layers of the third plurality of conductive layers, and the end portion of the second stacked body includes a second stair portion having a stair-like shape wherein a surface of each of the third plurality of conductive layers is exposed, and the second stair portion spaced from the first stair portion by a first distance.

First Embodiment

A semiconductor device according to a first embodiment is described with reference to FIG. 1 to FIG. 14.

Furthermore, in the following illustrations of the drawings, the same portions are denoted by the respective same reference numerals or characters. However, the drawings are schematic ones, in which, for example, the relationship and ratio between the thickness and the planar size may be different from those of an actual device.

FIG. 1 is a schematic plan view illustrating an example of a planar layout of principal elements of a semiconductor device on a substrate according to the present embodiment of the invention. FIG. 1 illustrates one chip, and the area of that one chip is mainly divided into a memory cell region 1 and a peripheral circuit region 6.

The memory cell region 1 is formed in the central portion of the chip, and the memory cell region 1 is configured with a memory cell array. The peripheral circuit region 6 is formed at the periphery of the memory cell region 1, and row decoders 3, 3', sense amplifiers 2, and other circuits are formed in the peripheral circuit region 6. Contact regions 4, 5 are arranged between the memory cell region 1 and the row decoders 3, 3'. The contact regions include a first contact region 4 and a second contact region 5. The memory cell array includes a plurality of conductive layers, each of which functions as a word line or a control gate, and is connected to one of the row decoders 3, 3' by an upper layer wiring in the contact regions 4 and 5.

Figure 2:
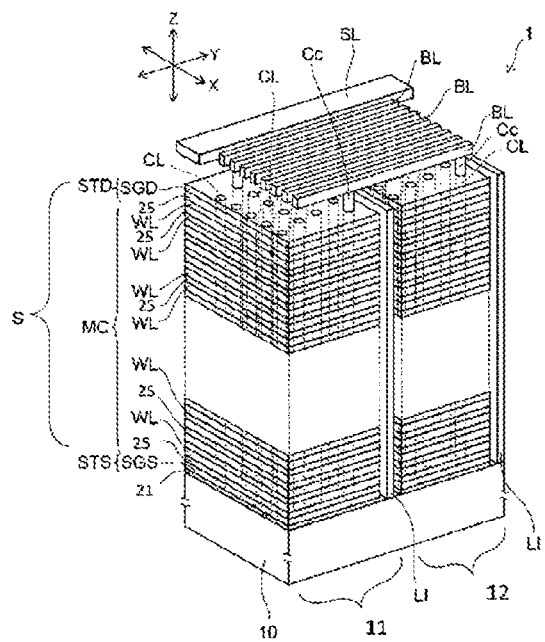
FIG. 2 is a diagram illustrating a memory cell region of the semiconductor device according to the first to third embodiments.

FIG. 2 illustrates an example of a structure of the memory cell array of the memory cell region 1 in the semiconductor device according to the present embodiment. Furthermore, in FIG. 2, for ease of understanding of the structure of the array, an insulating layer overlying the stacked body is omitted from the figure. Moreover, while in the following embodiments silicon is used as an example of a semiconductor material, a material other than silicon can be used as the semiconductor material.

Figure 3:
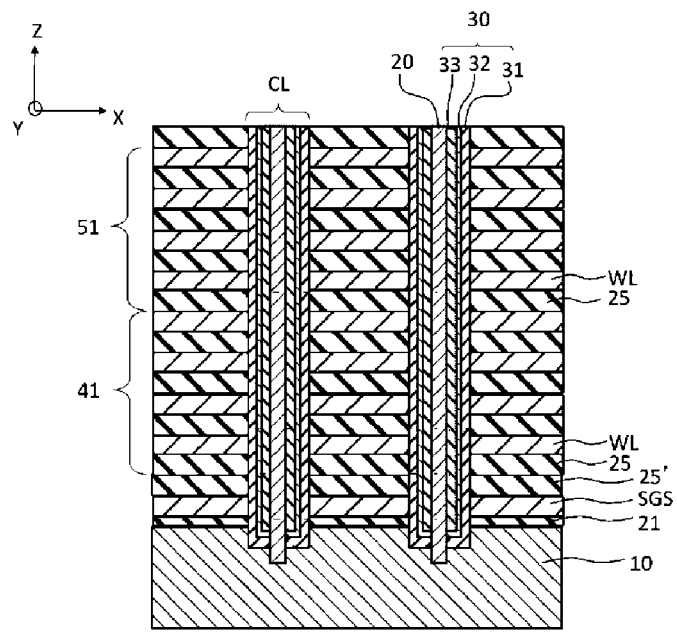
FIG. 3 is a diagram illustrating details of a memory cell illustrated in FIG. 2.

FIG. 3 is a sectional schematic view illustrating a part of a memory cell illustrated in FIG. 2. Furthermore, in FIG. 3, the upper layer wiring structure of the memory cell array of FIG. 2 is omitted from the illustration, and the number of conductive and insulating layers stacked one over the other in the memory cell array are reduced for ease of understanding.

Moreover, in the present specification, for ease of explanation an XYZ Cartesian coordinate system is used. In this coordinate system, two directions that are parallel to the principal surface of a substrate 10 and are orthogonal to each other are referred to as an X-direction and a Y-direction, and a direction that is orthogonal to both the X-direction and the Y-direction is referred to as a Z-direction. For example, as shown in FIG. 2, a plurality of conductive layers WL are stacked one over the other in the Z-direction and each extend in the X-direction.

As illustrated in FIG. 2, the memory cell region 1 includes a substrate 10, a stacked body S, a plurality of columnar portions CL, a wiring layer L1, and upper layer wiring. In FIG. 2, bit lines BL and a source layer SL are illustrated as the upper layer wiring.

A source-side selection gate SGS is provided on the substrate 10 via an insulating layer 21. A plurality of insulating layers 25 and a plurality of conductive layers WL are alternately stacked one over the other on and above the source-side selection gate SGS. A drain-side selection gate SGD is provided over the uppermost conductive layer WL on the uppermost insulating layer 25.

The conductive layer WL is divided into a plurality of blocks by a groove that extends in the X-direction. In FIG. 2, the plurality of blocks includes a block 11 and a block 12. The wiring layer L1, which extends in the X-direction and the Z-direction, is provided in each groove. Each wiring layer L1 extends between stacks of conductive layers WL. Although not illustrated, for example, a barrier film BM (a conductive film) can be provided on the surfaces (an upper surface, a lower surface, and side surfaces) of the plurality of conductive layers WL. Furthermore, the number of conductive layers WL illustrated in FIG. 2 is merely an example, and the actual number of conductive layers WL in an actual device is determined by the manufacturer of the device.

The conductive layer WL contains a conductive material including a metal or semiconductor. The conductive layer WL can contain at least one of tungsten, molybdenum, titanium nitride, tungsten nitride, silicon, and metal silicides. The source-side selection gate SGS and the drain-side selection gate SGD contain the same material as that of the conductive layer WL. The insulating layer 25 is, for example, silicon dioxide. The barrier filmBM contains, for example, titanium, and can be a multi-layer film made from titanium and titanium nitride.

The thickness of the drain-side selection gate SGD and the thickness of the source-side selection gate SGS can be, for example, the same as the thickness of one conductive layer WL, or can be greater than or less than the thickness of one conductive layer WL. Moreover, each of the drain-side selection gate SGD and the source-side selection gate SGS can be provided as a plurality of layers. Additionally, the term "thickness" as used herein refers to the thickness in the stacking direction (the Z-direction) of the above-mentioned stacked body on the substrate 10.

A plurality of columnar portions CL extending in the Z-direction are provided in the stacked body S. The columnar portions CL are provided, for example, as circular cylinder shapes or elliptic cylinder shapes. The columnar portions CL are electrically connected to the substrate 10. As illustrated in FIG. 3, the columnar portions CL include a channel body 20 and a memory film 30 surrounding the channel body 20. The memory film 30 includes a block insulating film 31, a charge storage layer 32, and a tunnel insulating film 33, and has, for example, an oxide-nitride-oxide (ONO) structure in which a silicon nitride film is sandwiched between a pair of silicon oxide films.

The memory film 30 and the channel body 20 extend in the Z-direction. The channel body 20 is, for example, composed primarily of silicon.

The block insulating film 31, the charge storage layer 32, and the tunnel insulating film 33 are provided in that order from the side of a conductive layer WL between each conductive layer WL and the channel body 20. The block insulating film 31 is in contact with the conductive layer WL, the tunnel insulating film 33 is in contact with the channel body 20, and the charge storage layer 32 is provided between and contacts the block insulating film 31 and the tunnel insulating film 33.

The channel body 20 functions as a channel, the conductive layer WL functions as a control gate, and the charge storage layer 32 functions as a data storage layer, which stores electric charge injected from the channel body 20. In other words, at the location at which the channel body 20 and each conductive layer WL intersect with each other, a memory cell is formed with a structure in which the circumference of the channel is surrounded by the control gate.

As illustrated in FIG. 2, a plurality of bit lines BL are provided over the stacked body S. The plurality of bit lines BL are separated from each other in the X-direction and extend in the Y-direction. The upper end of each channel body 20 in a block 11, 12 is electrically connected to a bit line BL through a contact portion Cc. The lower end (inwardly of the stacked body) of the channel body 20 contacts the substrate 10. A columnar portion CL of each of the block L1, L2 is connected to a single specific bit line BL, such that a plurality of channel bodies 20 of the selected plurality of columnar portions CL are electrically connected to one common bit line BL.

As shown in FIG. 2 a drain-side selection transistor STD is provided at the upper end of the columnar portion CL, and a source-side selection transistor STS is provided at the lower end of the columnar portion CL. The selection gates SGD and SGS function as the respective gate electrodes, i.e., selection gates, of the selection transistors STD and STS. Insulating films functioning as the gate insulating films of the selection transistors STD and STS are provided between the respective selection gates SGD and SGS and the channel body 20.

A plurality of memory cells MC in which each conductive layer WL serves as a control gate therefor are provided between the drain-side selection transistor STD and the source-side selection transistor STS along a channel body 20. The plurality of memory cells MC are stacked in layers spaced from each other by the insulating layers 25. The plurality of memory cells MC, the drain-side selection transistor STD, and the source-side selection transistor STS are connected in series via the channel body 20, thus constituting one memory string along the channel body. The memory strings are arranged in a staggered manner along the plane direction parallel to an X-Y plane, so that a plurality of memory cells MC are three-dimensionally provided in the X-direction, the Y-direction, and the Z-direction.

The semiconductor device according to the present embodiment is able to freely perform data erasure and data writing, and is also able to retain the stored content even during shutoff of the power supply thereto.

Figure 4:
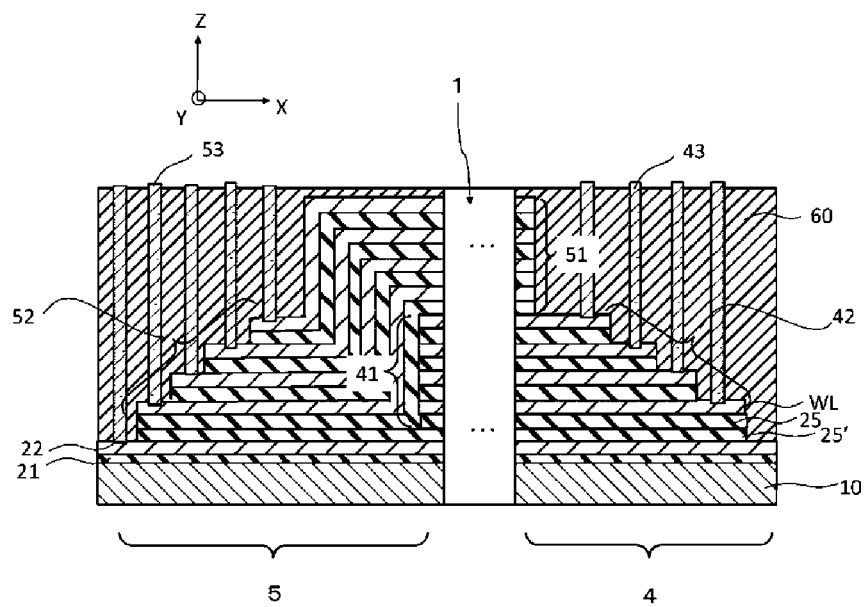
FIG. 4 is a diagram illustrating contact regions of the semiconductor device according to the first embodiment.

Next, configurations of the first and second contact regions 4 and 5 are described. FIG. 4 is a sectional schematic view of the XZ plane of the first and second contact regions 4 and 5 which are located on opposed sides of the memory cell region 1, which are configured to connect the respective conductive layers WL thereof to the upper layer wiring. As with the planar layout illustrated in FIG. 1, each of the first contact region 4 and the second contact region 5 are located between the memory cell region 1 and a corresponding row decoder 3, 3'. In other words, referring to FIG. 4, the memory cell region 1, the specific illustration of which is omitted here, is provided between the first contact region 4 and the second contact region 5 along the X-direction.

Each of the first and second contact regions 4 and 5 has a structure in which insulating layers 25 and conductive layers WL are alternately stacked one over the other on the semiconductor substrate 10. These conductive layers WL and insulating layers 25 are similar to the above-mentioned conductive layers WL and insulating layers 25 contained in the stacked body S of the memory cell region 1, so that the conductive layers WL and insulating layers 25 at the lower portion of the stacked body S of the memory cell region 1 extend into the first contact region 4, and the conductive layers WL and insulating layers 25 corresponding to the upper portion of the stacked body S extend into the second contact region 5. Furthermore, while, in FIG. 4, the conductive layers WL and insulating layers 25 are illustrated as being each eight layers in each of the lower stacked body 41 and the upper stacked body 51 of FIG. 4 S, the number of layers is not limited to this number. Moreover, the total number of layers can differ between the upper portion and the lower portion of the memory cell region 1.

In the description of the first and second contact regions 4 and 5, it is assumed that the extension of the conductive layers WL of the memory cell region 1 thereinto is divided into, for example, a lower stacked body 41 which contains four conductive layers WL corresponding to four conductive layers WL in the lower portion of the stacked body S of the memory cell region 1, and an upper stacked body 51, which contains four conductive layers WL corresponding to four conductive layers in the upper portion of the stacked body S of the memory cell region 1, above those conductive layers in the stacked body S which correspond to the lower stacked body 41. Furthermore, the number of conductive layers WL in the stacked body S of the memory cell region 1 is not limited to eight, but may be greater or fewer. Moreover, the number of conductive layers WL contained in each of the lower stacked body 41 and the upper stacked body 51 is also not limited to four, and together are be based on the number of conductive layers in the upper and lower portions of the stacked body S.

Furthermore, besides the above-mentioned lower stacked body 41 and upper stacked body 51, an insulating layer 21, and a conductive layer 22 formed thereover, are formed on the substrate 10 below the lower stacked body 41 and the upper stacked body 51. The insulating layer 21 and the conductive layer 22 are present in at least the memory cell region 1 and the first and second contact regions 4 and 5, and the conductive layer 22 corresponds to the source-side selection gate SGS in the memory cell array illustrated in FIG. 2.

As illustrated in FIG. 4, in the first contact region 4, a plurality of (for example, four) insulating layers 25 and a plurality of (for example, four) conductive layers WL, which constitute the lower stacked body 41, are alternately stacked one over the other on the conductive layer 22. Furthermore, as illustrated in FIG. 4, to increase the overall thickness of the lowermost insulating layer 25 of the lower stacked body 41 on the conductive layer 22, an additional insulating layer 25' is optionally provided between the lower stacked body 41 and the conductive layer 22. This helps prevent leakage current flowing from the lowermost conductive layer WL to the conductive layer 22.

The end portion of the lower stacked body 41 adjacent to the side of the row decoder 3 in the X-direction has a first stair structure portion 42 having a stair-like shape. The conductive layers WL of the lower stacked body 41 in the first contact region 4 are formed simultaneously with and integrally connected to the respective four conductive layers WL in the lower portion of the stacked body S of the memory cell region 1. In other words, the conductive layers WL of the first stair structure portion 42 are electrically connected to the respective four conductive layers WL in the lower portion of the memory cell region 1. For example, the lowermost conductive layer WL of the first stair structure portion 42 (that one closest to the substrate 10) is connected to the lowermost conductive layer WL in the memory cell region 1, and the conductive layer WL at the fourth step of the first stair structure portion 42 (that one fourth from the substrate 10) is connected to the fourth from the substrate 10 conductive layer WL in the memory cell region 1.

The end portion of each conductive layer WL of the first stair structure portion 42 has a contact electrode 43 extending therefrom in the direction away from the substrate 10 in the Z direction to connect to the upper layer wiring (not illustrated). The contact electrode 43 is positioned, for example, on the portion of a conductive layer WL of the first stair structure portion 42 which is not covered by an overlying conductive layer WL, and, for example, one contact electrode 43 is provided to contact each conductive layer WL.

The upper stacked body 51 is located adjacent to, and in part above, the lower stacked body 41. Also in the upper stacked body 51, as with the lower stacked body 41, a plurality of (for example, four) insulating layers 25 and a plurality of (for example, four) conductive layers WL are alternately stacked one over the other. The upper stacked body 51 does not extend above the first stair structure portion 42 of the lower stacked body 41. Therefore, the conductive layers WL exposed at the end portion of the first stair structure portion 42 are not covered with the upper stacked body 51. Furthermore, the end portion of the upper stacked body 51 extending over the lower stacked body in the first contact region 4 has no stair structure.

As with the lower stacked body 41, the conductive layers WL of the upper stacked body 51 in the second contact region 5 are formed simultaneously with and integrally connected to the conductive layers WL on the upper portion of the stacked body S of the memory cell region 1, but a portion of the upper stacked body 51 does not need to extend across the first contact region 4 as illustrated in FIG. 4.

Next, the configuration of the second contact region 5 is described.

The second contact region 5 has a structure in which a portion of the upper stacked body 51 is located directly on the conductive layer 22 located over the substrate 10. Moreover, the end portion of the upper stacked body 51 located directly on the conductive layer 22, on the row decoder 3' side of the upper stacked body 51 in the X-direction, has a second stair structure portion 52.

As mentioned above, the upper stacked body 51 corresponds to, for example, eight layers of the upper portion of the stacked body S of the memory cell region 1 (four conductive layers and four insulating layers). In other words, the conductive layers WL of the second stair structure portion 52 are electrically connected to respective ones of four conductive layers WL in the upper portion of the memory cell region 1.

As illustrated in FIG. 4, the end portion of the lower stacked body 41 terminates in an end wall at a location on the second contact region 5. Additionally, a portion of the upper stacked body 51 extends vertically along the side wall of the first stacked body 41 in the second contact region 5, and another portion of the upper stacked body 51 is located on the conductive layer 22 and extend in the x-direction away from the side wall of the first stacked body 41 in the second contact region 5. The thickness, in the Z direction, of the upper stacked body 51 located on the conductive layer 22 in the second contact region 5 is equal to the thickness of the lower stacked body 41 in the first contact region 4. The term "vertical" as used herein includes a case where the angle formed by the upper stacked body 51 and the substrate 10 is 45 degrees or more and 135 degrees or less. Moreover, the term "equal" includes a case where the difference in height between a conductive layer of one stacked body and a corresponding conductive layer of the other stacked body is less than the total film thickness of one conductive layer and one insulating layer. The same also applies to the following description.

With regard to the upper stacked body 51, similarly, a second stair structure portion 52 is provided at the end portion of the upper stacked body 51 on the conductive layer 22 at the row decoder 3' side thereof in the X-direction. Moreover, the conductive layers WL at the end portions of the second stair structure portion 52 have a structure in which the surface of a conductive layer WL is not covered by an overlying conductive layer WL. Each conductive layer WL is thus exposed at the end portion of the second stair structure portion 52, and, as in the first contact region 4, the end portion of each conductive layer WL has a contact electrode 53 configured to extend therefrom in the Z direction to connect to the upper layer wiring (not illustrated).

The lower stacked body 41, which includes the first stair structure portion 42, and the upper stacked body 51, which includes the second stair structure portion 52, are covered with an interlayer insulating film 60. The interlayer insulating film 60 is, for example, a silicon oxide layer. The upper surface of the interlayer insulating film 60 is planarized, and the depths of the respective contact electrodes 43 and 53 extending inwardly of the planarized upper surface, which lead from the upper surface of the interlayer insulating film 60 to the respective exposed end portions of the conductive layers WL, differ based on the different heights of each exposed end portion of a conductive layer WL above the substrate 10. The contact electrode that leads to the lowermost (lowest-step) conductive layer WL is deeper and has a higher aspect ratio (the ratio of the depth to the hole diameter) than those connected to conductive layers WL over the lowermost conductive layer WL.

The contact electrodes 43 and 53 can be made from, for example, a combination of a barrier metal having good adhesion properties, such as titanium and titanium nitride, and a metal which is readily embeddable into the high aspect ratio opening with good electrical conductivity properties, such as tungsten, copper, and ruthenium. For example, in the device, tungsten is embedded inside a barrier metal, and the barrier metal contacts the sidewalls of the holes in the insulating layer 60.

Four conductive layers WL in the lower portion of the stacked body S of the memory cell region 1 are connected to the upper layer wiring through respective contact electrodes 43, which are connected individually to the exposed upper surfaces of the conductive layers WL of the first stair structure portion 42 of the lower stacked body 41, and four conductive layers WL in the upper portion of the stacked body S of the memory cell region 1 are connected to the upper layer wiring through respective contact electrodes 53, which are connected individually to the exposed upper surfaces of the conductive layers WL of the second stair structure portion 52 of the upper stacked body 51.

Furthermore, while, in FIG. 4 and subsequent figures, layers of the lower stacked body 41 and the upper stacked body 51 are illustrated in straight line paths, curved paths may actually be present.

Figure 32:
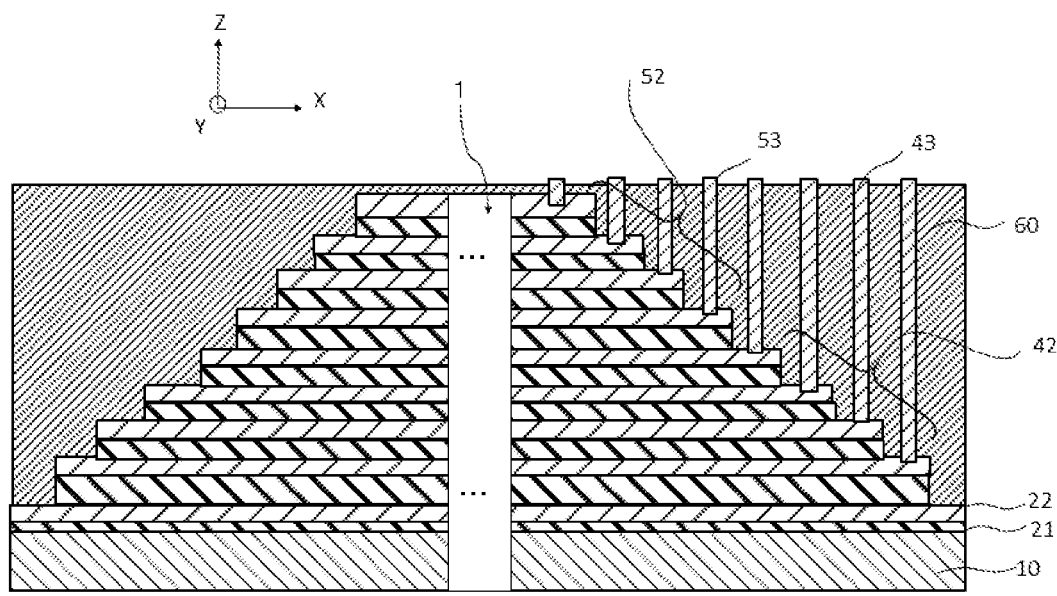
FIG. 32 is a diagram illustrating contact regions of a semiconductor device according to a comparative example.

According to the above-described embodiment, the conductive layers in the lower portion and upper portion of the stacked body S of the memory cell region are connected into stacked bodies in different ones of the first and second contact regions 4 and 5 for contact with the upper wiring layer, and thus the chip area of the contact regions can be reduced as compared with a case where the lower layer side and an upper layer side are located over the first and the second contact regions 4 and 5. As shown in a comparative example of FIG. 32, in the prior fabrication process, the first and second (and any additional) stair structure portions 42, 52 extend from both sides of the memory cell region, and the length of the device is longer in the x-direction. In the first embodiment, by forming one of the first and second stair structure portions 42, 52, for example the lower stacked body stair structure, on one side of the memory cell region, and forming the other one of the first and second stair structure portions 42, 52, for example the upper stacked body stair structure, on the other side of the memory cell region, the width of the device in the X-direction is reduced.

Furthermore, the first stair structure portion 42 of the lower stacked body 41 is provided at the same height above the substrate 10 as is the second stair structure portion 52 of the upper stacked body 51, so that the formation of the contact electrodes 43 and 53 can be facilitated by reducing the differences in the overall penetration depths thereof inwardly of the upper surface of the interlayer insulating layer 60.

Moreover, since it is possible to make the heights of the lower stacked body 41 and the upper stacked body 51 the same without using a difference in level such as by removing a portion of the underlying substrate or an underlying material, the number of process steps used to produce the device can be reduced.

Next, a method for forming the first and second contact regions 4 and 5 in the semiconductor device according to the present embodiment is described with reference to FIG. 5 to FIG. 10.

Figure 5:
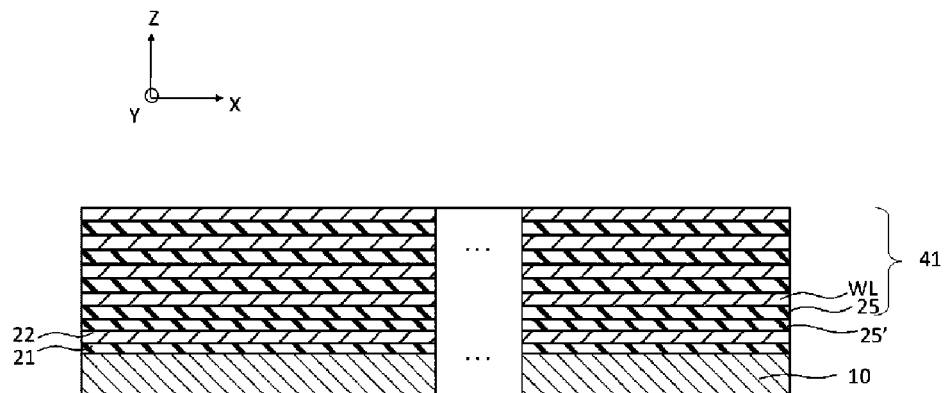
FIG. 5 is a diagram illustrating a result of a step of a method for manufacturing the contact regions of the semiconductor device according to the first embodiment.
Figure 6:
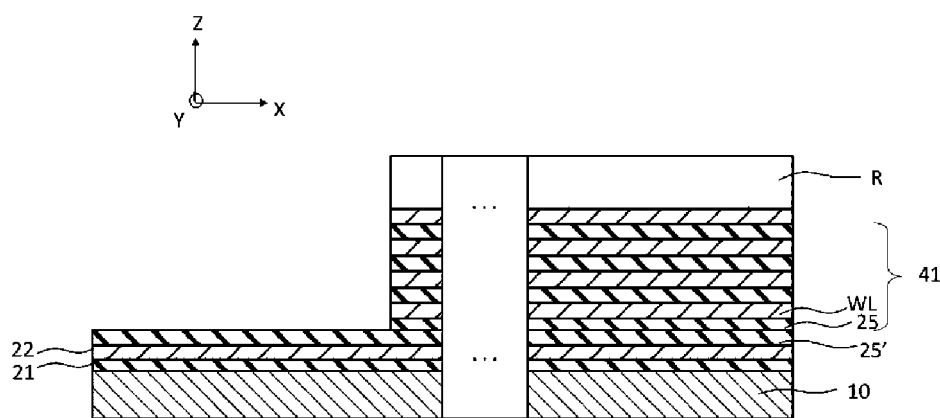
FIG. 6 is a diagram illustrating a result of a step of a method for manufacturing the contact regions of the semiconductor device according to the first embodiment.

Initially, an insulating layer 21 is formed over the whole surface of the substrate 10, which includes the memory cell region 1, the first contact region 4, the second contact region 5, and the peripheral circuit region 6, and thereafter the conductive layer 22 is formed on the insulating layer 21. The conductive layer 22 in the memory cell region 1 functions as the source-side selection gate SGS. As illustrated in FIG. 5, in this embodiment the insulating layer 25' is formed on the conductive layer 22. Moreover, before forming the above-described stack of conductive layers WL and insulating layers 25 on the substrate 10, a transistor (not illustrated) of the peripheral circuit region 6 is formed on the surface of the substrate 10 in the peripheral circuit region 6.

Next, the insulating layers 25 and the conductive layers WL are formed one over the other on the insulating layer 25' as illustrated in FIG. 5, thus forming the insulating layers 25 and the conductive layers WL from which the lower stacked body 41 will be defined. The insulating layers 25 and the conductive layers WL comprising the lower stacked body 41 are also formed over the whole surface of the substrate 10 including the memory cell region 1, the first contact region 4, the second contact region 5, and the peripheral circuit region 6.

The insulating layer 21, the conductive layer 22, the insulating layers 25 (25'), and the conductive layers WL are formed by, for example, a chemical vapor deposition (CVD) method.

Next, a resist film R is applied onto the entire insulating layers 25 and the conductive layers WL from which the lower stacked body 41 will be defined, and it is then patterned by a patterning process such as photolithography. Using the patterned resist film R as a mask, the lower stacked body 41 is defined by etching away the portion of the insulating layers 25 and the conductive layers WL from which the lower stacked body 41 is defined which is not covered by resist, resulting in the structure of FIG. 6, while leaving the insulating layer 21 and the conductive layer 22 in the second contact region 5 not etched away.

Figure 7:
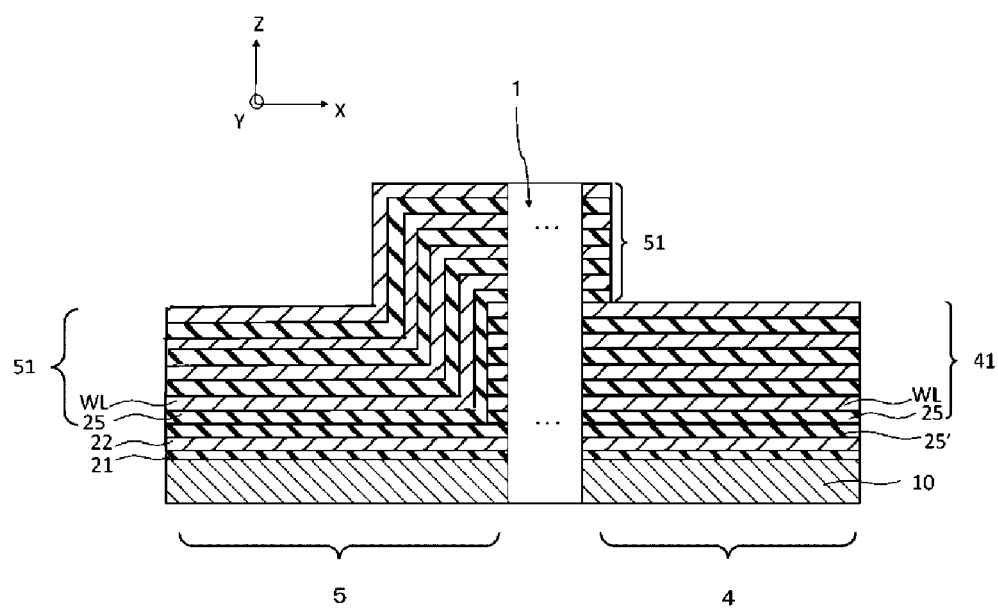
FIG. 7 is a diagram illustrating a result of a step of a method for manufacturing the contact regions of the semiconductor device according to the first embodiment.

Next, as illustrated in FIG. 7, the resist film R is removed, and the insulating layers 25 and the conductive layers WL from which the upper stacked body 51 will be defined are formed over the memory cell region 1, the first and second contact regions 4 and 5, and the peripheral circuit region 6. Then, the insulating layers 25 and conductive layers WL from which the upper stacked body will be defined are coated with a resist film, the resist film is patterned, and the insulating layers 25 and the conductive layers WL not covered by the resist are removed by etching using the resist as a mask as was performed with the lower stacked body 41, to form the upper stacked body 51. At this time, since the overall thickness of the insulating layers 25 and the conductive layers WL is approximately the same in the upper stacked body 51 and the lower stacked body 41, the lower stacked body 41 in the first contact region 4 and the upper stacked body 51 in the second contact region 5 have the same thickness and thus extend the same height above the upper surface of the conductive film 22. Since this same height is not provided by utilizing a difference in level by removing material of the substrate or an underlying material, it is possible to more easily make the height of the lower stacked body 41 and the upper stacked body 51 above the substrate uniform.

Figure 8:
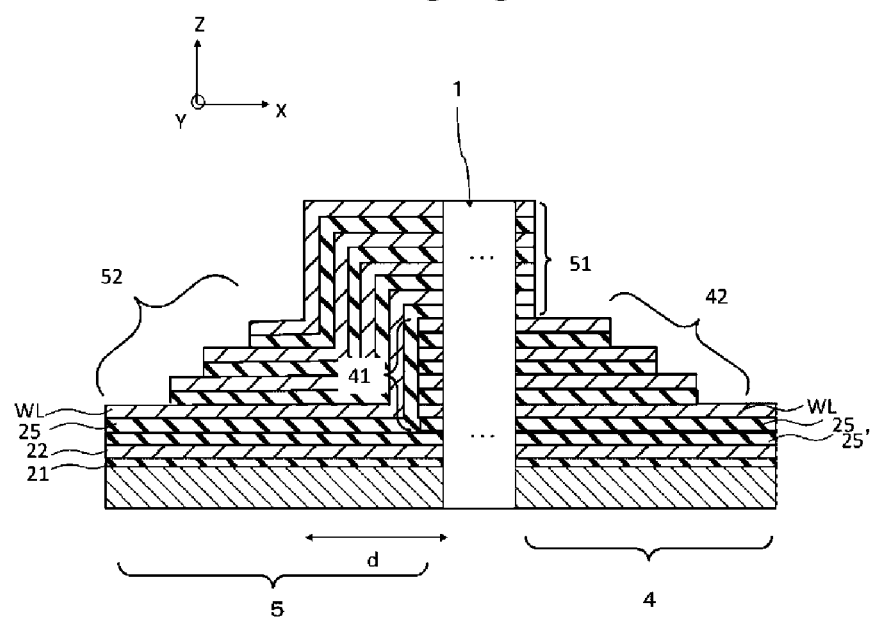
FIG. 8 is a diagram illustrating a result of a step of a method for manufacturing the contact regions of the semiconductor device according to the first embodiment.

Next, as illustrated in FIG. 8, the respective end portions of the lower stacked body 41 and the upper stacked body 51 adjacent the sides of the row decoders 3, 3' in the X-direction are etched into a stair-like shape using a resist film and an etching process. More specifically, in this process, a resist slimming process to reduce the planar size of the resist film, and an etching process using the resist film as a mask to etch away the conductive layer WL and the insulating layer 25 located directly below the conductive layer WL, is repeated layer by layer. At the same time, on the second contact region 5, the end portions are processed into a stair-like shape, which is spaced away from the end portion of the lower stacked body 41 in the X-direction by the overall film thickness "d" of the upper stacked body 51 or more. This is because in a portion of the upper layer, the thickness of the film stack of the upper layer having the thickness "d" extends generally perpendicular to the upper surface of the substrate 10 along the sidewall of the lower stacked body 41, as illustrated in FIG. 8.

Figure 9:
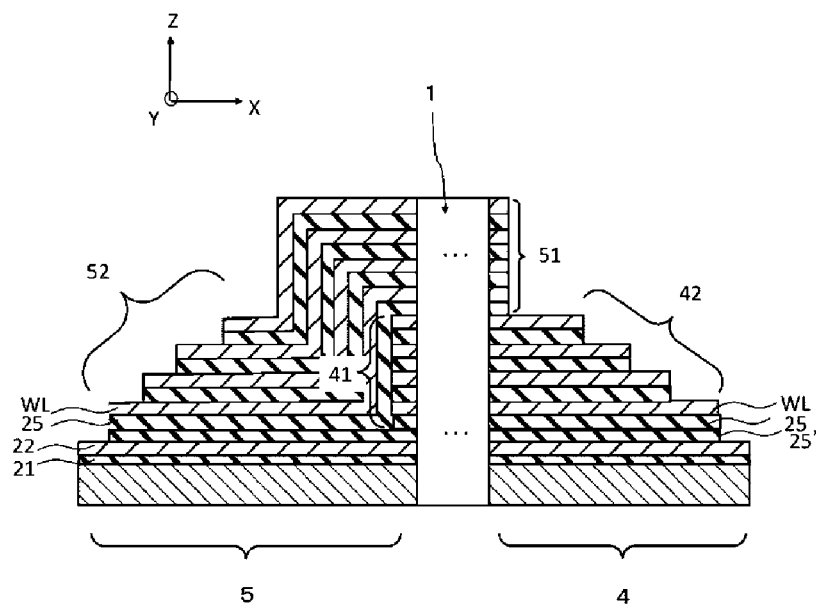
FIG. 9 is a diagram illustrating a result of a step of a method for manufacturing the contact regions of the semiconductor device according to the first embodiment.

Next, as illustrated in FIG. 9, because the lowermost conductive layer WL and insulating layer 25 (and the insulating layer 25') of each of the lower stacked body 41 and the upper stacked body 51 were processed into a stair-like shape as described above, the conductive layer 22 is exposed. The reason why separate stair forming processes illustrated in FIGS. 8 and 9 are performed as described above is that, for example, the presence of the additional insulating layer 25' causes the film thickness of the combined lowermost insulating layers 25, 25' to vary from place to place.

Figure 10:
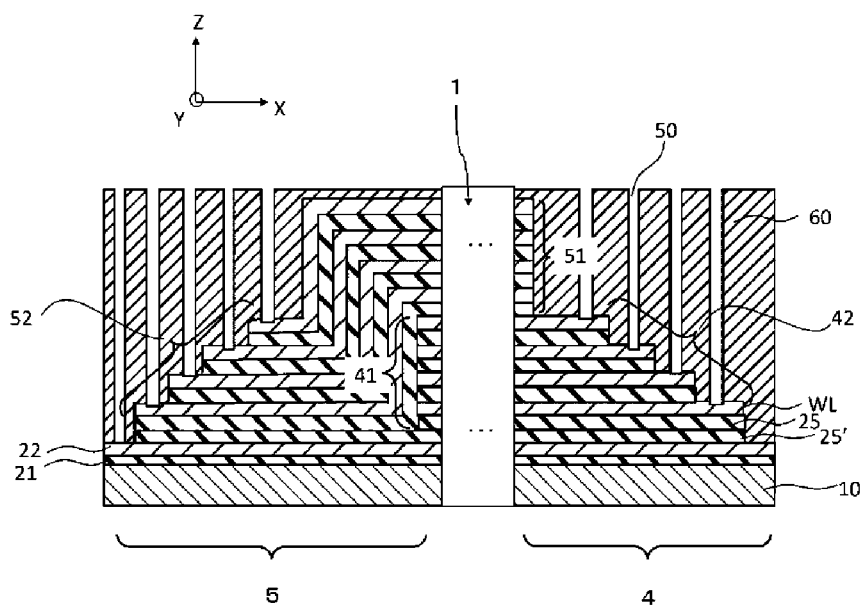
FIG. 10 is a diagram illustrating a result of a step of a method for manufacturing the contact regions of the semiconductor device according to the first embodiment.

Next, as illustrated in FIG. 10, the lower stacked body 41 and the upper stacked body 51 are covered with the interlayer insulating film 60, which is, for example, a silicon dioxide film, and the interlayer insulating film 60 is polished and thus planarized using, for example, a chemical mechanical polishing (CMP) method. Thereafter a plurality of contact holes 50 are etched to penetrate through the interlayer insulating film 60, using, for example, a reactive ion etching (RIE) method. The contact holes 50 are formed in such a manner so as to end on respective exposed portions of the conductive layers WL at the steps of the corresponding lower stacked body 41 and upper stacked body 51.

After forming the contact holes 50, a conductive material is embedded into each of the contact holes 50, thus forming the contact electrodes 55 as illustrated in FIG. 4.

With the above-described processes, the first and second contact regions 4 and 5 of the semiconductor device according to the first embodiment are completed.

Figure 11:
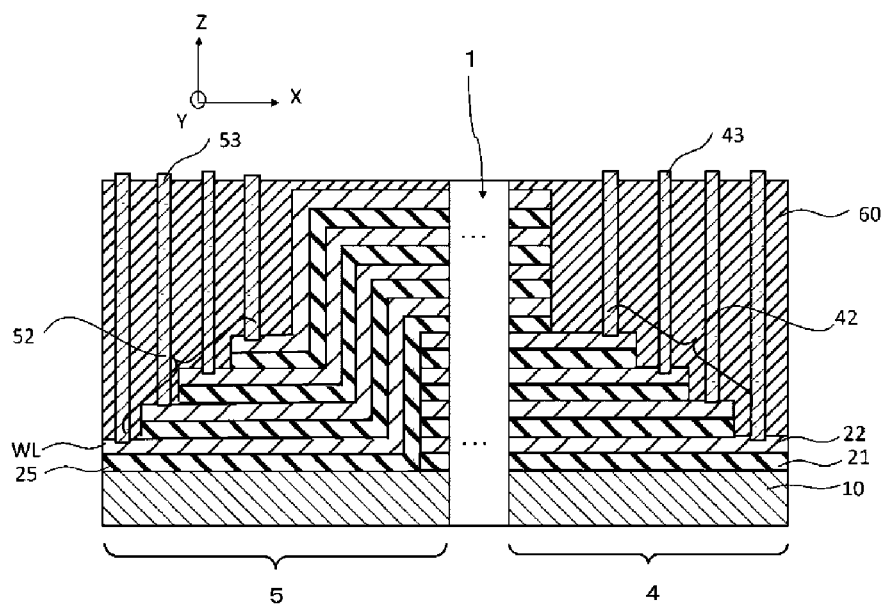
FIG. 11 is a diagram illustrating a result of a step of a method for manufacturing the contact regions of the semiconductor device according to the first embodiment.

Furthermore, in the present embodiment, in consideration of the number or thickness of insulating layers 21 and conductive layers (SGS) 22 and the total number of insulating layers 25 and conductive layers WL of the stacked bodies, the insulating layer 21 and the conductive layer (SGS) 22 can be present in only the lower stacked body 41 as illustrated in FIG. 11. In this case, it is only necessary to control, for example, the number or thickness of insulating layers 21 and conductive layers (SGS) 22 in such a way that the lower stacked body 41 and the upper stacked body 51 have the same stacked layer thickness and extend the same height above the conductive layer 22.

Figure 12:
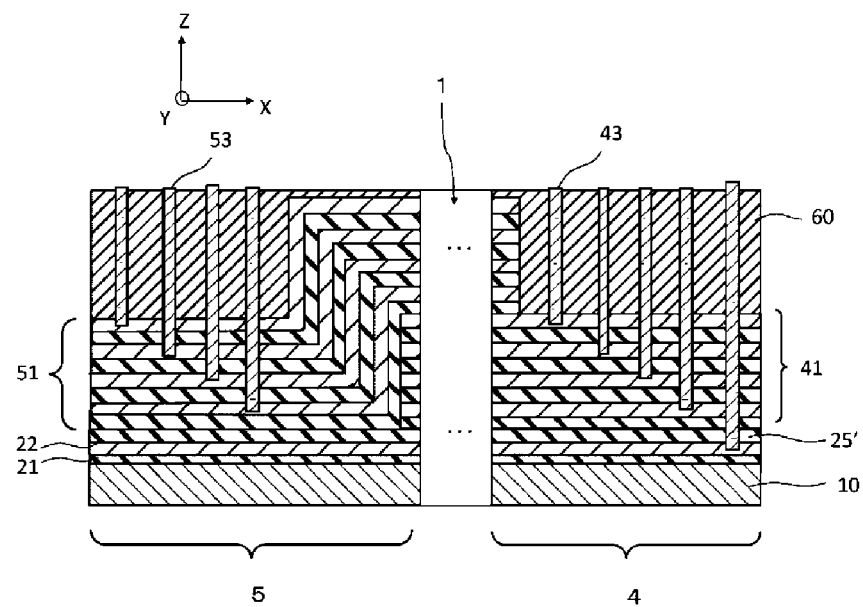
FIG. 12 is a diagram illustrating a modification example of the contact regions of the semiconductor device according to the first embodiment.

As shown in FIG. 12, as an alternative to processing the end portions of the lower stacked body 41 and the upper stacked body 51 into a stair-like shape, contact electrodes 53 can be formed through the insulating film 60 to individual ones of the conductive layers 22 in each stacked body. In this case, using a patterned resist, openings or holes for contact electrodes 43 are opened into the insulating layer 60 in such a manner that the number of different depths thereof from the upper surface of the insulating film 60 varies by $2^n$, where n is number of conductive layers shared in the upper and lower stacked bodies 41, 51. With such a construction employed, since the etching process of the stair forming process can be omitted, the number of processes can be significantly reduced.

Furthermore, in a method for forming the memory cell region 1 of FIG. 12, the insulating layer 21 and the conductive layer (SGS) are formed as in the first contact region 4, and a stacked body composed of the lower stacked body 41 and the upper stacked body 51 is formed on the conductive layer (SGS). The entire stacked body is then covered with an interlayer insulating film. After that, the upper surface of the stacked body in the memory cell region 1 is planarized using the CMP method. After the planarization, for example, the formation of holes for the memory film 30, the formation of the memory film 30, and the formation of the channel body 20 are performed. After that, trenches that extend in the X-direction and Z-direction are formed to a depth which extends through the stacked body and to the substrate. The wiring layer L1 is formed in each of the trenches, and then, the memory cell array illustrated in FIG. 2 as an example is completed.

Furthermore, a method in which a conductive layer is not first formed in the array region is possible. In that case, insulating layers and sacrificial layers, which are used in place of conductive layers, are alternately stacked one by one in layers. The insulating layer contains, for example, an oxide of silicon, and the sacrifice layer contains, for example, a nitride of silicon. After, for example, the formation of holes for the memory film 30, the formation of the memory film 30, and the formation of the channel body 20 are collectively performed on the stacked body, the sacrifice layers are removed by etching through openings obtained by the formation of the trenches, and conductive layers are formed in regions from which the sacrificial layers have been removed.

Next, a modification example of the semiconductor device according to the present embodiment is described. The semiconductor device in the modification example has a structure in which at least one stop layer, such as an insulating layer, is provided between the lower portion of the memory cell region 1 having conductive layers connected to those in the lower stacked body 41 and the upper portion of the memory cell region 1 having conductive layers connected to those in the upper stacked body 51. With such a structure employed, in forming a memory cell region 1 of the semiconductor device in which, for example, the number of stacked conductive layers WL is great, the holes for embedding the memory film 30 of the lower stacked body 41 and the upper stacked body 51 can be formed not collectively, but in a plurality of operations.

Figure 13A:
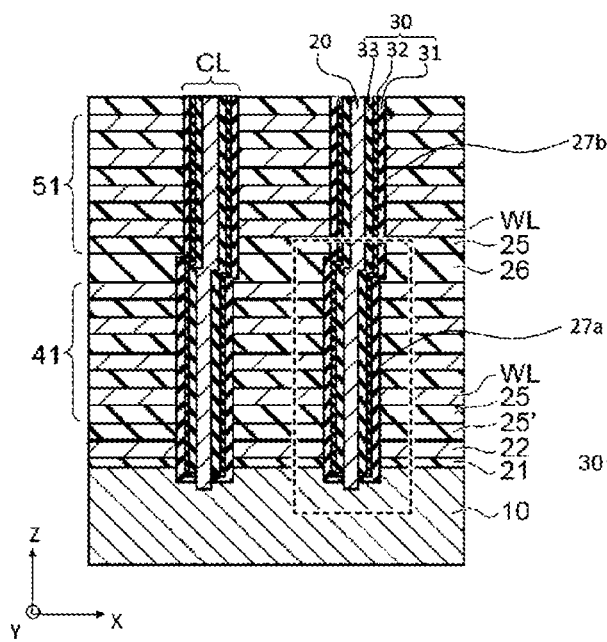
FIGS. 13A and 13B are diagrams illustrating a memory cell region of a modification example of the semiconductor device according to the first embodiment.

FIG. 13A is a sectional schematic view illustrating a part of the memory cell region 1 in the modification example. Furthermore, for convenience, a part of the configuration is omitted from the illustration. As illustrated in FIG. 13A, a stop layer 26 is provided between the lower portion of the memory cell array 1 having conductive layers connected to those in the lower stacked body 41 and the upper portion of the memory cell array 1 having conductive layers connected to those in the upper stacked body 51. The remaining configuration of the memory cell region 1 is similar to that illustrated in FIG. 3. The memory film holes 50 in the lower portion of the memory cell array 1 having conductive layers connected to those in the lower stacked body 41 are connected to the corresponding memory holes 50 of the upper portion of the memory cell array 1 having conductive layers connected to those in the upper stacked body 51 through the stop layer 26. The stop layer 26 is, for example, an insulating film, such as a silicon oxide film, and is formed, for example, having a thickness thicker than the insulating layer 25.

Figure 13B:
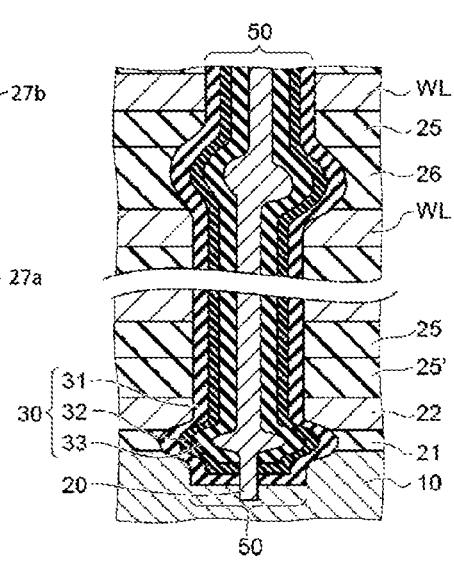

FIG. 13B is an enlarged view illustrating a portion of the memory cell region 1 indicated by a dashed line in FIG. 13A. In the memory cell region 1, a partially rounded and bulging structure such as that illustrated in FIG. 13B can be formed in the stop layer 26 and the insulating layer 21 by using a different material than that of the insulating layers 25, including, for example, alumina or hafnium oxide, as the stop layer material (etch stop). In that case, as illustrated in FIG. 13B, the diameter or width of the memory hole 50 within the stop layer 26 becomes larger than that in the adjacent layers because of increased etching of the alumina or hafnium oxide as compared to the etching of the conductive layers 22 and insulating layers 25, so that an unintended, or intended, alignment shift of the memory hole 50 in the x-y plane between the location thereof through lower portion of the memory cell array 1 and the location thereof through the upper portion of the memory cell array 1 can be larger, i.e., an offset in the location of the memory hole 50 in each of the upper and lower portions of the memory cell array 1 can be accommodated to a greater extent.

The method for forming the memory cell region 1 in the modification example, as with the memory cell region in the first embodiment, begins with the forming of the insulating layer 21 and the conductive layer 22 (SGS) on the substrate 10, and then forming the plurality of insulating layers 25 and the plurality of conductive layers WL which will constitute the lower portion of the memory cell array 1 having conductive layers connected to those in the lower stacked body 41 as well as those in the lower stacked body 41. A resist film is formed on these insulating layers 25 and conductive layers WL and etching is performed using the resist film as a mask to form a first memory hole 27a. A sacrificial layer is deposited in the first memory hole 27a, after which the sacrificial layer is planarized using the CMP method.

Next, the stop layer 26 is formed on the plurality of insulating layers 25 and the plurality of conductive layers WL having the sacrificial layer embedded in the first memory hole 27a, and thereafter a plurality of insulating layers 25 and a plurality of conductive layers WL, which constitute the upper portion of the memory cell array and the layers of the upper stacked body 51, are formed on the stop layer 26. A resist film is then formed on these layers, and a second memory hole 27b extending from the upper surface of these layers toward the first memory hole 27a is formed by etching. At this time, since the stop layer 26 serves as an etch stop material, the etching of the second memory hole 27b stops without penetrating through the stop layer 26. Thereafter, the stop layer 26 is etched, so that the second memory hole 27b reaches the first memory hole 27a through the stop layer 26. Moreover, the location where the second memory hole 27b is formed is set to approximately the same position as the position at which the first memory hole 27a was formed.

Next, after removing the sacrificial layer, the insulating layer 21 and the stop layer 26 are recessed (enlarged or undercut) using a wet etchant supplied thereto through the first and second memory holes 27a and 27b (at this point of time, a continuous memory hole 27 in which the second memory hole 27b has reached the first memory hole 27a). This makes the diameters of the memory hole 27 located in the insulating layer 21 and the stop layer 26 larger, thus forming a rounded and bulging structure such as that described above.

Then, the memory film 30 and the channel body 20 are formed as in the first embodiment, thus completing the memory cell region 1 in the modification example.

Figure 14:
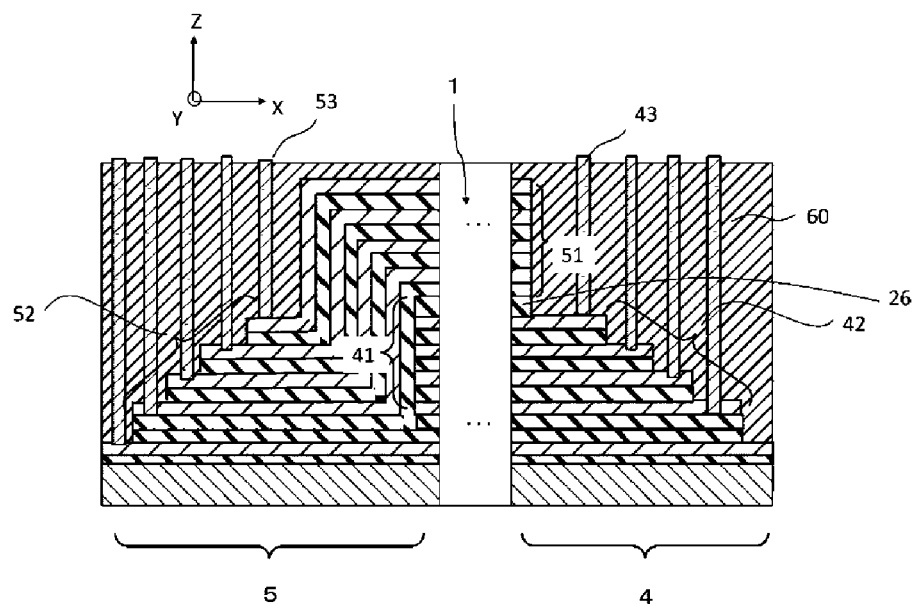
FIG. 14 is a diagram illustrating contact regions of the modification example of the semiconductor device according to the first embodiment.

FIG. 14 is a cross-sectional view in the XZ plane of the first and second contact regions 4 and 5 in the modification example. The stop layer 26 is provided between the lower stacked body 41 and the upper stacked body 51. The stop layer 26 is formed on the lower stacked body 41 and is then subjected to etching at the same time as the lower stacked body 41. After that, since the upper stacked body 51 is formed on the stop layer 26, the heights of the stair structure portions 42 and 52 of the lower stacked body 41 and the upper stacked body 51 above the conductive layer are the same.

In the semiconductor device according to the modification example, since the stop layer 26 is provided between the lower and upper portions of the memory cell array 1, in a case where it is difficult to collectively form memory holes when the number of stacked conductive layers WL is large, the memory holes can be formed in a plurality of operations wherein each partial hole extends through a smaller thickness of material, so that the formation of the memory holes is made easier.

In the semiconductor device according to the modification example, since a different one of the first and second stacked bodies 41, 51 is located in the first and second contact regions 4 and 5, the area of a stair structure portion can be reduced as compared with a case where both the lower stacked body and the upper stacked body are contained in both of the first and second contact regions 4 and 5, so that the chip area can be reduced.

Furthermore, the second stair structure portion 52 of the upper stacked body 51 is provided at the same height above the conductive layer 22 as that of the first stair structure portion 42 of the lower stacked body 41, so that the formation of the contact electrodes 43 and 53 can be facilitated.

Since a difference in depth or aspect ratio between a contact hole leading to the uppermost conductive layer WL of the upper stacked body 51 and a contact hole leading to the lowermost conductive layer WL of the lower stacked body 41 is reduced, the etching time required to collectively form a plurality of contact holes corresponding to the number of conductive layers can be significantly decreased. Moreover, since a difference in depth between contact holes can be reduced, excessive etching and resulting widening of the shallower (less deep) contact holes can be prevented.

Furthermore, the heights of the stair shaped portions of lower stacked body 41 and the upper stacked body 51 above the substrate 10 can be made uniform without using a difference in height created by removing a portion of the substrate or an underlying film.

Second Embodiment

Hereinafter, a second embodiment is described with reference to FIG. 15 to FIGS. 22A and 22B.

The second embodiment differs from the first embodiment in a structure of contact regions, in which the stair shaped portions of the lower stacked body and the upper stacked body are formed in such a way as to face in the same direction.

Furthermore, the remaining structure of the memory cell region 1 is similar to that in the first embodiment, and is, therefore, omitted from the description.

Figure 15:
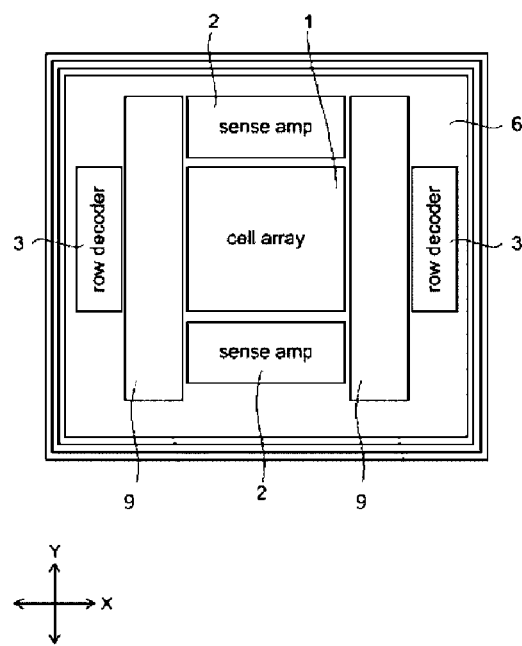
FIG. 15 is a schematic view illustrating a planar layout of principal elements of a semiconductor device according to a second embodiment.

FIG. 15 is a schematic view illustrating an example of a planar layout of principal elements of a semiconductor device according to the second embodiment. In the present embodiment, there are provided two contact regions 9, which are respectively located between the memory cell region 1 and the row decoders 3, 3'. The two contact regions 9 have a structure that straddles the memory cell region 1 and is line-symmetric with respect to the Y-axis. Furthermore, only one of the two contact regions 9 need be provided.

Hereinafter, the contact region 9 in the semiconductor device according to the second embodiment is described.

Figure 16A:
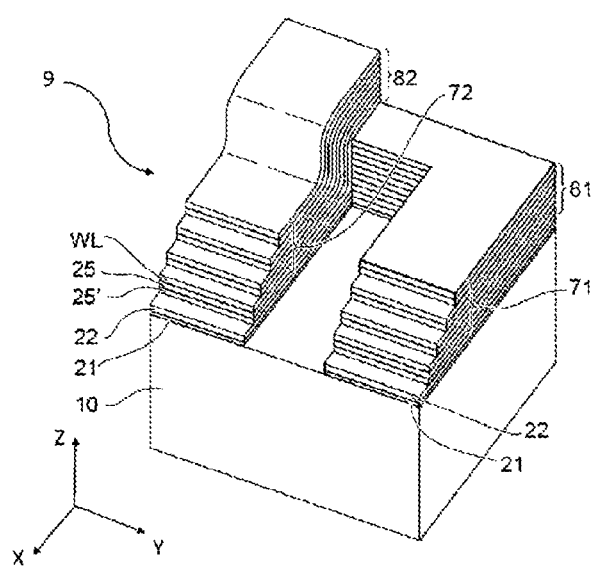
FIGS. 16A and 16B are diagrams illustrating contact regions of the semiconductor device according to the second embodiment.
Figure 16B:
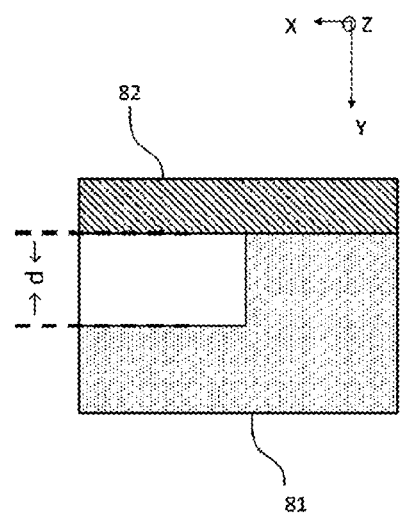

FIG. 16A is a perspective view illustrating the contact region 9 according to the second embodiment. FIG. 16A illustrates one contact region 9 that extends from one block (for example, the block 11 or 12) located between wiring layers L1 in FIG. 2. FIG. 16B illustrates the plan layout of the contact region 9. Furthermore, in FIGS. 16A and 16B, the wiring layer L1 is not illustrated.

As illustrated in FIG. 16A, the contact region 9 includes an insulating layer 21, a conductive layer 22, a lower stacked body 81, and an upper stacked body 82. The conductive and insulating layers of the memory cell region extend from the memory cell region 1 into the lower stacked body 81 and the upper stacked body 82. Moreover, the end portions of the lower stacked body 81 and the upper stacked body 82 alongside the row decoder 3 in the X-direction have a first stair structure portion 71 and a second stair structure portion 72, and the exposed conductive layers thereof are connected to the upper layer wiring by contact electrodes (not illustrated). The first stair structure portion 71 is formed at the end of the lower stacked body 81, and the second stair structure portion 72 is formed at the end of the upper stacked body 82.

Furthermore, in the present embodiment, as in the first embodiment, the insulating layer 21 and the conductive layer 22, which corresponds to the source-side selection gate SGS of the memory cell region 1, are formed under the stacked bodies 81, 82. Moreover, an insulating layer 25' can be provided between the conductive layer 22 and the lower stacked body 81.

In the end portions of the first and second stair structure portions 71 and 72, the surface of a conductive layer WL is not covered by an overlying conductive layer WL and insulating layer 25, and is thus exposed from above (the side opposite to the substrate 10). Similarly, the surface of the conductive layer 22 at the base of the end of the stair structure portions 71, 72 is not covered by an overlying conductive layer WL and is thus is exposed from above. These exposed surfaces are provided with a contact electrode (not illustrated), and are each thus connected to the upper layer wiring. For example, the number and thicknesses of insulating layers 21 and conductive layers 22 are not limited. For example, in a case where there are a plurality of conductive layers 22, the insulating layers 21 and conductive layers 22 are processed into a stair-like shape in the pattern of the stair structure portions 71 and 72.

Furthermore, while, in FIG. 16A, a structure in which four conductive layers WL and four insulating layers 25 are alternately stacked one over the other in each of the lower stacked body 81 and the upper stacked body 82 is illustrated, the number of layers is not specifically limited.

Moreover, as illustrated in FIG. 16B, an internal space indicated by a distance "d" is present between the first stair structure portion 71 and the second stair structure portion 72 in the Y-direction and along the upper surface of substrate 10.

In the present embodiment, the first and second stair structure portions 71 and 72 are formed in one contact region 9. Thus, in the contact region 9, contact is made with both the lower stacked body 81 and the upper stacked body 82. While, in FIG. 15, contact regions 9 are formed at two positions, contact electrodes here are formed only in the one of the contact regions 9 where the stacked bodies 71, 72 are present.

Next, a method for forming the contact region 9 of the semiconductor device according to the second embodiment is described with reference to the perspective views of FIGS. 17A and 17B to FIGS. 21A and 21B. Furthermore, portions of the device similar to those of the first embodiment are omitted from the description.

Figure 17A:
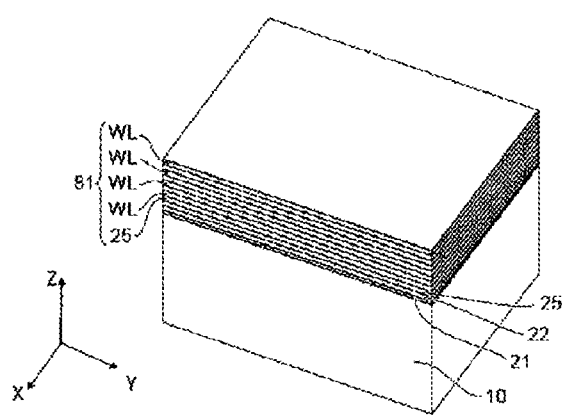
FIGS. 17A and 17B are diagrams illustrating a result of a step of a method for manufacturing the contact regions of the semiconductor device according to the second embodiment.

As illustrated in FIG. 17A, as in the first embodiment, an insulating layer 21 and a conductive layer 22 are formed, and thereafter alternating insulating layers 25 and conductive layers WL are formed one over the other on the conductive layer 22, thus forming the conductive and insulating layers to form the lower stacked body 81. Furthermore, in FIG. 17A, to increase the film thickness of the insulating layer 25 on the conductive layer 22, an insulating layer 25' can be provided between the insulating layer 25 on the conductive layer 22 and the lower stacked body 81.

Figure 17B:
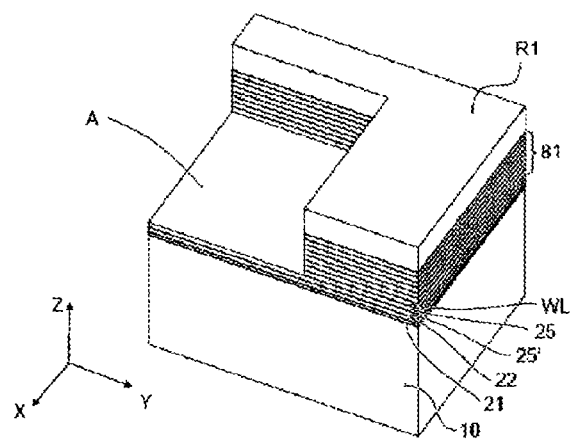

Next, a first resist film R1 is applied over the stack of conductive and insulating layers, and the first resist film is patterned, such as by a first photolithography process. Using the patterned first resist film R1 as a mask, the lower stacked body 81 is defined out of the stack of conductive and insulating layers as illustrated in FIG. 17B. The insulating layer 21, the conductive layer 22, and the insulating layer 25' are not etched and remain on the upper surface of the substrate 10. Furthermore, as the insulating layers 25 and conductive layers 22 were formed over the entire upper surface of the substrate 10, and thus over the other contact region 9, these layers in the contact region 9 at the adjacent block can also be formed into a shape which is line-symmetric with that in the contact region 9 shown in in FIG. 17B with respect to the X-axis.

Figure 18A:
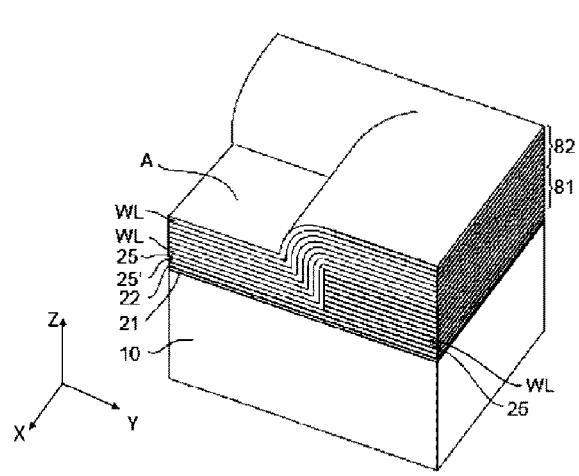
FIGS. 18A and 18B are diagrams illustrating a result of a step of a method for manufacturing the contact regions of the semiconductor device according to the second embodiment.

Next, as illustrated in FIG. 18A, the conductive layers 22 and insulating layers 25 from which the upper stacked body 82 will be defined are formed on the region A (first region) in which the conductive and insulating layers from which the lower stacked body 81 was defined were etched away, and over the lower stacked body 81. At this time, since the thicknesses of each insulating layer 25 and each conductive layer WL are approximately the same, the lower stacked body 81 and the upper stacked body 82 formed on the region A are equal in thickness and extend the same height above the conductive layer 22. Furthermore, a part of the upper stacked body 82 is formed along the side of the lower stacked body 81 and is thus extends vertically with respect to the substrate 10.

Figure 18B:
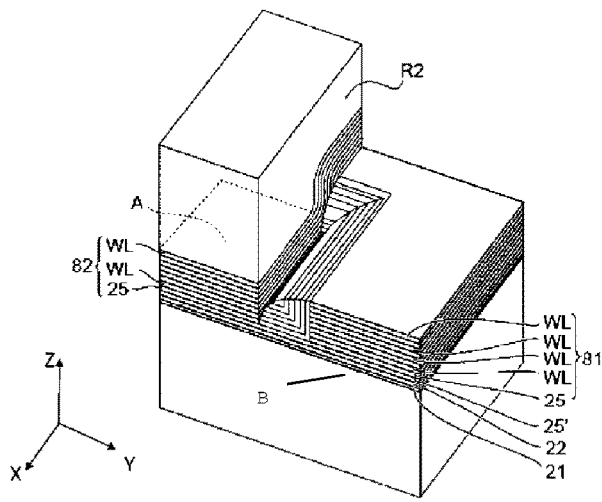

Next, a second resist film R2 is formed over the plurality of conductive layers 22 and insulating layers 25 from which the upper stacked body 82 will be defined, and the second resist film R2 is patterned by a second patterning process, such as a photolithography process. The second resist film R2 projects over the region A. Thereafter, using the second resist film R2 as a mask, the plurality of conductive layers 22 and insulating layers 25 from which the upper stacked body 82 will be defined is selectively etched away, defining the upper stacked body 82 in area A as shown in FIG. 18B. The patterned second resist film R2 remains over the plurality of conductive layers 22 and insulating layers 25 from which the upper stacked body 82 will be defined after patterning at a location that is spaced by the distance "d" or more of FIG. 16B from the facing wall of the lower stacked body 81 along which the conductive layers 22 and insulating layers 25 from which the upper stacked body 82 was defined extend vertically away from the region A in the Y-direction, where the distance "d" is the thickness of the upper stacked body 82. This is because, in a case where the above-mentioned distance "d" is less than the film thickness of the upper stacked body 82, there may remain a portion of the conductive layers WL and insulating layers 25 in the upper stacked body 82 which are not horizontal, i.e. generally not in the plane of the upper surface of the substrate 10, between the area A and the area B of FIG. 18B.

Figure 19A:
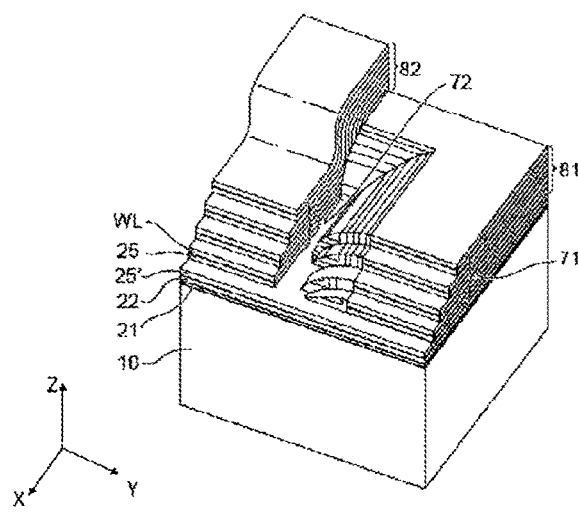
FIGS. 19A and 19B are diagrams illustrating a result of a step of a method for manufacturing the contact regions of the semiconductor device according to the second embodiment.

Next, as illustrated in FIG. 19A, the respective end portions of the lower stacked body 81 and the upper stacked body 82 are etched into a stair-like shape in such a way as to cause the conductive layers WL at the ends thereof to be exposed from above.

Figure 19B:
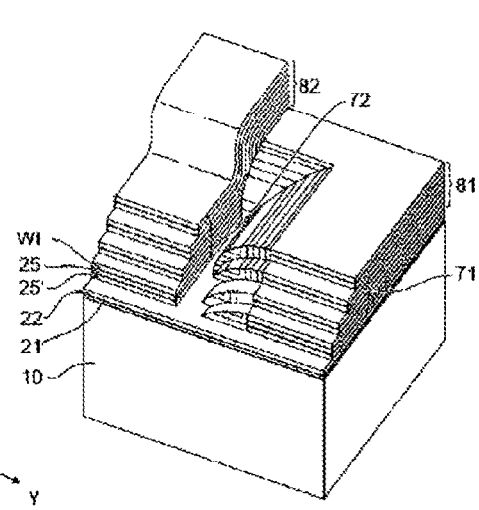

Next, as illustrated in FIG. 19B, the end portion of the insulating layer 25' located on the conductive layer 22 is etched away in such a way as to cause the end portion of the lowermost conductive layer 22 to be exposed from above. Thus, the end portions of the conductive layers 22 and WL are exposed.

Figure 20:
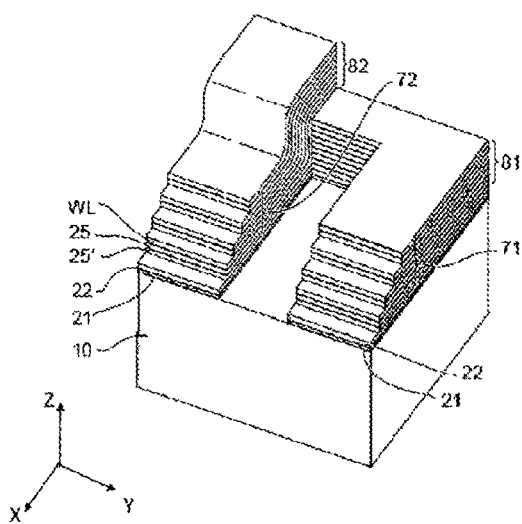
FIG. 20 is a diagram illustrating a result of a step of a method for manufacturing the contact regions of the semiconductor device according to the second embodiment.

In the above-mentioned method of formation, since a part of the conductive layers WL and insulating layers 25 are removed to form the lower stacked body 81 and additional the conductive layers 22 and insulating layers 25 are formed on the conductive layer 22 where the conductive layers 22 and insulating layers 25 from which the lower stacked body 71 was formed were removed to define the lower stacked body 81, there is a region in which the conductive layers 22 and insulating layers 25 from which the upper stacked body 82 is defined are not horizontal with respect to the substrate 10 as mentioned above. If etching is performed in that region, there is a possibility that a remnant conductive film is not completely removed by etching. As illustrated in FIG. 20, the residual film from the conductive layers 22 and insulating layers 25 from which the upper stacked body 82 was formed, which were not completely removed during the etching to define the upper stacked body 82, can be removed by re-performing etching while masking over the upper stacked body 82 and lower stacked body 81.

Finally, as in the first embodiment, an interlayer insulating film is formed over the entirety of the resulting structure, and contact holes are then etched thereinto, which are used to connect the exposed conductive layers 22 and WL to the upper layer wiring, thus forming contact electrodes.

With the above-described process, the contact region 9 of the semiconductor device according to the second embodiment is completed.

Figure 21A:
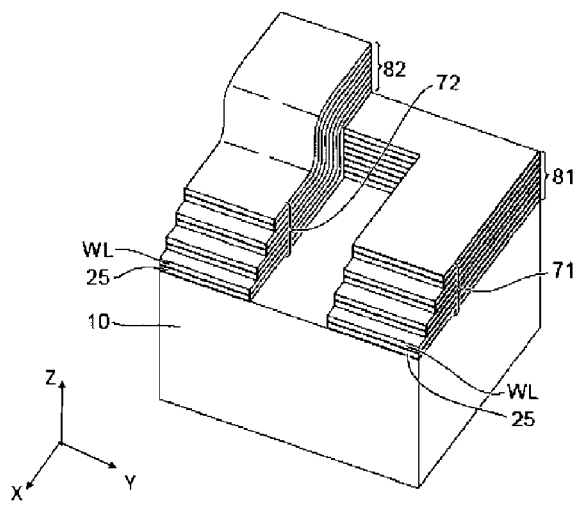
FIGS. 21A and 21B are diagrams illustrating contact regions of the semiconductor device according to the second embodiment.

Furthermore, as illustrated in FIG. 21A, as in the first embodiment, in consideration of, for example, the number of conductive layers (SGS) 22 and the thickness of the entire stacked body, it is possible to cause the insulating layer 21 and the conductive layer (SGS) 22 to be contained in the lower stacked body 81. In this case, since the number of processes is decreased, the contact region 9 is able to be easily formed.

Figure 21B:
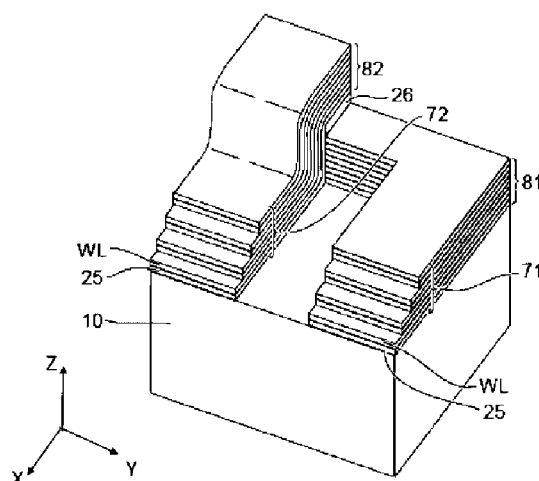

Moreover, it is possible to form a contact region 9 adapted for the memory cell region 1 having the structure described in the modification example of the first embodiment. In this case, as illustrated in FIG. 21B, a stop layer 26, which is an insulating film including, for example, a silicon oxide film, is only formed between the lower stacked body 81 and the upper stacked body 82.

In the semiconductor device according to the present embodiment, the heights of the contact electrodes 55 contacting the conductive layers WL of the upper stacked body 82 and the lower stacked body 81 have less variation in depth, so that the formation of the contact electrodes 55 is facilitated. Moreover, since the length of the contact region 9 in the X-direction is made shorter as compared with a case where the second stair structure portion 72 of the upper stacked body 82 is formed on the lower stacked body 81, the stair shaped portion area can be reduced.

Furthermore, since both the lower stacked body and the upper stacked body are located in one contact region 9, the number of stacked layers or the position of a stacked body can be easily changed as compared with that in the first embodiment, and various patterns can be set.

Third Embodiment

Hereinafter, a third embodiment is described with reference to FIGS. 22A and 22B to FIG. 31.

The third embodiment, as compared with the second embodiment, employs a method in which, in a semiconductor device having, for example, a great number of stacked conductive layers WL, a contact region is formed which is not divided into two stacked bodies, i.e., a lower layer body and an upper stacked body, but into three stacked bodies, i.e., a lower stacked body, a middle stacked body, and an upper stacked body, wherein the designations upper, middle and lower relate the portion of the stacked conductive layers in the memory cell region 1 connected to one of these stacked bodies.

Furthermore, the structure of the memory cell region 1 and the configuration of the planar layout are similar to those in the second embodiment, and their constructs are therefore omitted from the description.

Figure 22A:
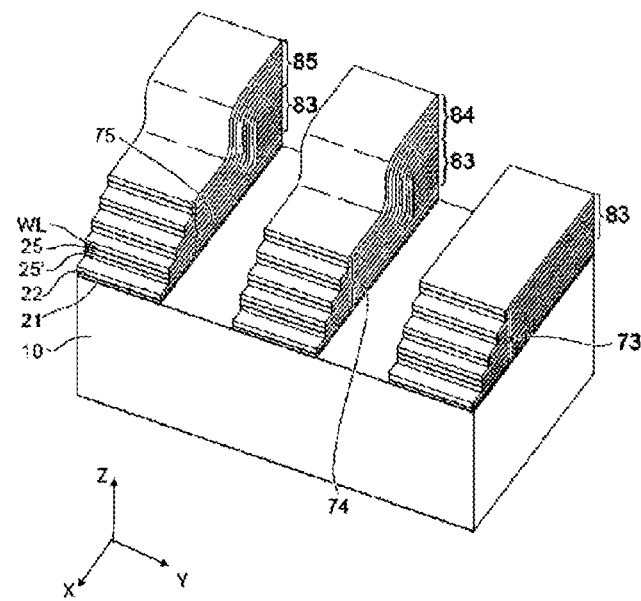
FIGS. 22A and 22B are diagrams illustrating contact regions of a semiconductor device according to a third embodiment.
Figure 22B:
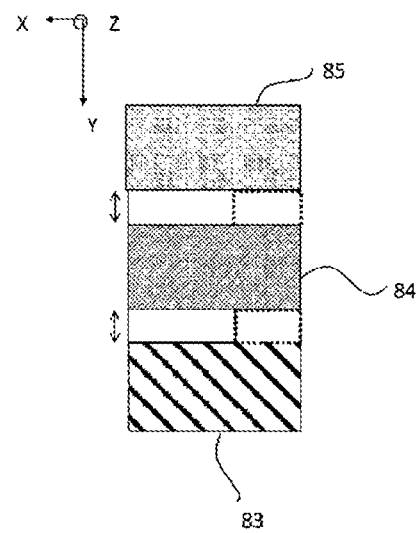

FIG. 22A is a perspective view illustrating a contact region 9 of one block defined by the wiring layers L1 extending in the Z direction in FIG. 2, in the semiconductor device according to the third embodiment. FIG. 22B illustrates a plan layout of the contact region 9. As illustrated in FIGS. 22A and 22B, in the third embodiment, the contact region 9 is configured of three stacked bodies. The stacked bodies in the present embodiment include a lower stacked body 83, a middle stacked body 84, and an upper stacked body 85.

In the present embodiment, first, second, and third stair structure portions 73, 74, and 75 are formed in the end portions of the respective lower, middle and upper stacked bodies 83, 84 and 85 alongside the row decoder 3 of FIG. 1. The conductive layers WL at each layer in the respective end portions of the first, second, and third stair structure portions 73, 74, and 75 are exposed from above at the ends thereof, and the exposed conductive layers WL are connected to the upper layer wiring via the contact electrodes (not illustrated).

As illustrated in FIG. 22B, to form the first, second, and third stair structure portions 73, 74, and 75 of the stacked bodies on a portion thereof which is horizontal with respect to the substrate 10, a space having a width corresponding to the film thickness "d", or greater, of each stacked body is provided between each adjacent stacked body, for example between the lower stacked body 83 and the middle stacked body 84, and between the middle stacked body 84 and the upper stacked body 85.

Next, a method for forming the stacked bodies 83, 84 and 85 in the contact region 9 in the semiconductor device according to the third embodiment is described with reference to the perspective views of FIGS. 23A and 23B to FIG. 29. Furthermore, processes of forming the stacked bodies similar to those in the second embodiment are omitted from the description.

Figure 23A:
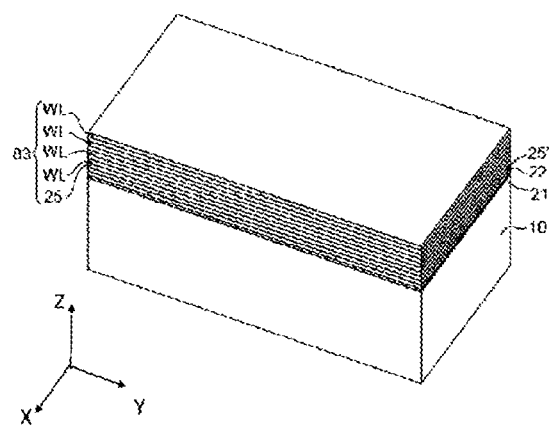
FIGS. 23A and 23B are diagrams illustrating a result of a step of a method for manufacturing the contact regions of the semiconductor device according to the third embodiment.

As illustrated in FIG. 23A, as in the first and second embodiments, the insulating layer 21 and the conductive layer 22 are formed, and a plurality of alternating insulating layers 25 (25') and conductive layers WL are formed one over the other on the conductive layer 22, thus forming the insulating layers 25 and conductive layers WL from which the lower stacked body 83 will be defined.

Figure 23B:
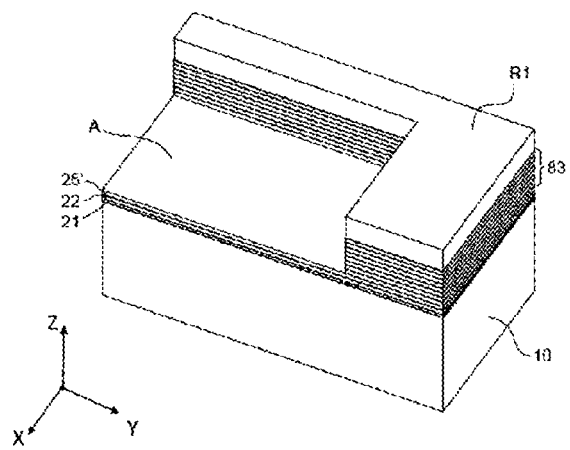

Next, a first resist film R1 is applied to the insulating layers 25 and conductive layers WL from which the lower stacked body 83 will be defined, and the resist film R1 is patterned by a first patterning process, such as a photolithography process. Using the patterned first resist film R1 as a mask, the insulating layers 25 and conductive layers WL are etched to define the lower stacked body 83 and form a region A where the insulating layers 25 and conductive layers WL from which the lower stacked body 83 was defined have been removed, as illustrated in FIG. 23B.

Figure 24A:
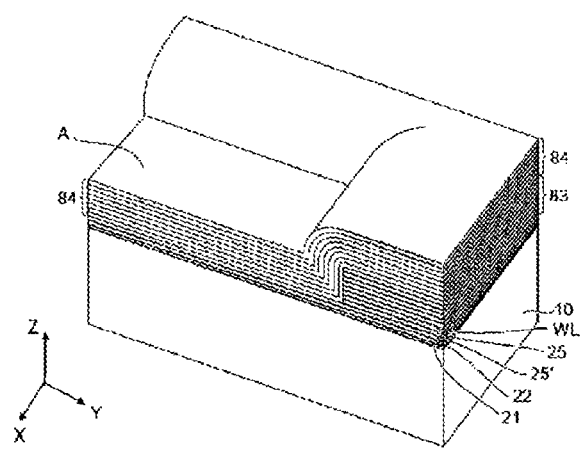
FIGS. 24A and 24B are diagrams illustrating a result of a step of a method for manufacturing the contact regions of the semiconductor device according to the third embodiment.

Next, as illustrated in FIG. 24A, the insulating layers 25 and conductive layers WL from which the middle stacked body 84 will be defined are formed over the whole surface of the substrate 10. Thus, the insulating layers 25 and conductive layers WL from which the middle stacked body 84 will be defined are located on the lower stacked body 83 and the region A. At this time, since the thicknesses of each insulating layer 25 and each conductive layer WL are approximately the same, the thickness of the lower stacked body 83 and the insulating layers 25 and conductive layers WL from which the middle layer side stacked body 84 will be defined located on the region A are equal to each other.

Figure 24B:
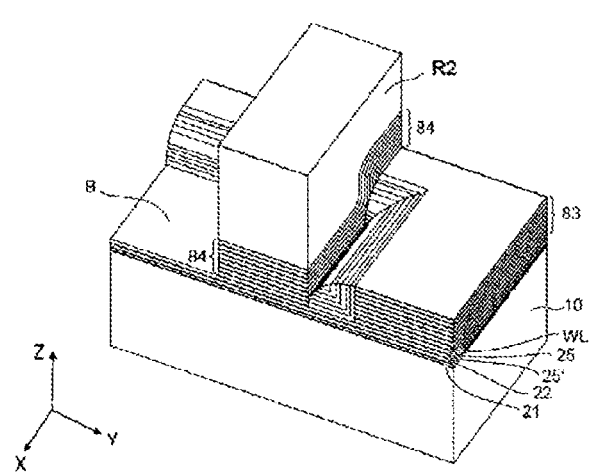

Next, a second resist film R2 is formed on the insulating layers 25 and conductive layers WL from which the middle stacked body 84 will be defined, and the second resist film R2 is patterned by a second patterning process, such as a photolithography process such that the second resist film R2 remains on the region A, and the portion thereof closest to the side of the lower stacked body 83 in the Y-direction is located the film thickness "d" distance from the lower stacked body 83 as illustrated in FIG. 24B. Then, using the second resist film R2 as a mask, the middle stacked body 84 is defined. As a result, a region B remains in which both the lower stacked body 83 and the middle layer side stacked body 84 are not present.

Figure 25:
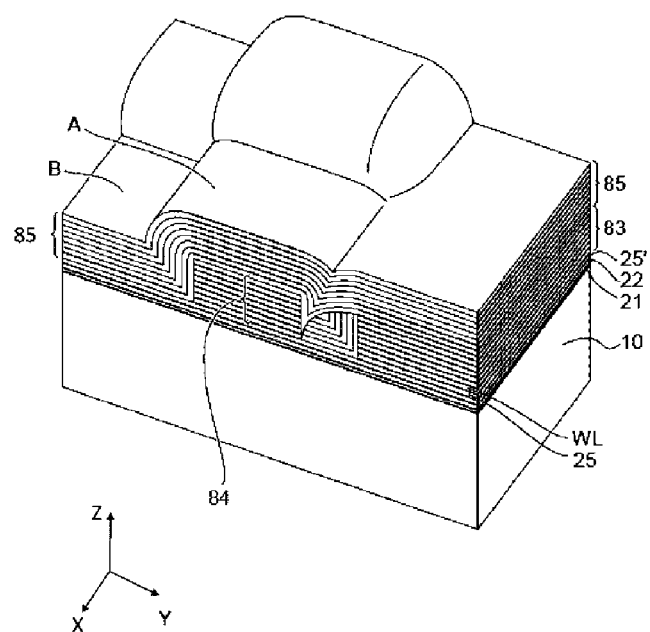
FIG. 25 is a diagram illustrating a result of a step of a method for manufacturing the contact regions of the semiconductor device according to the third embodiment.

Next, the insulating layers 25 and conductive layers WL from which the upper stacked body 85 will be defined are formed over the whole surface of the substrate 10 and the previously defined lower stacked body 83 and middle stacked body 84, including on the region B, as illustrated in FIG. 25. At this time, since the thicknesses of each insulating layer 25 and each conductive layer WL used to form the stacked bodies are approximately the same, the thickness of the middle layer side stacked body 84 formed on the region A and the stack of insulating layers 25 and conductive layers WL from which the upper stacked body 85 will be defined formed on the region B are the same as the thickness of the lower stacked body 83. Furthermore, portions of the insulating layers 25 and conductive layers WL making up the middle stacked body 84 and the upper stacked body 85 are formed along the side of the lower stacked body 83 and are thus extend vertically to the upper surface of the substrate 10.

Figure 26:
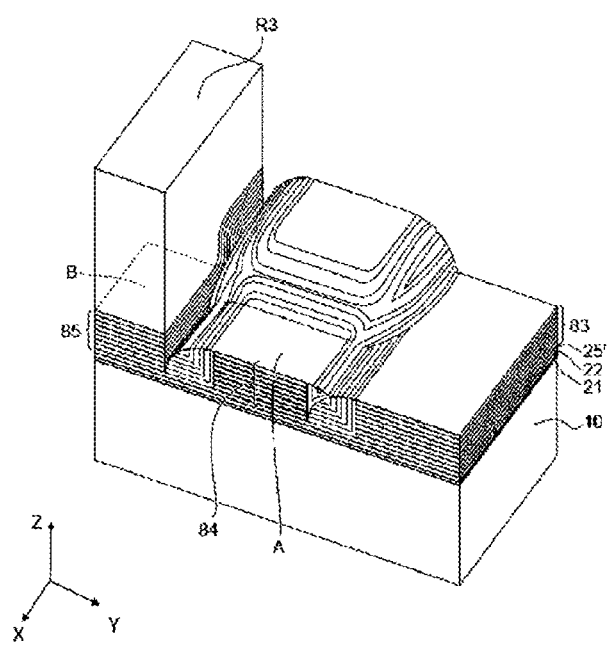
FIG. 26 is a diagram illustrating a result of a step of a method for manufacturing the contact regions of the semiconductor device according to the third embodiment.
Figure 27:
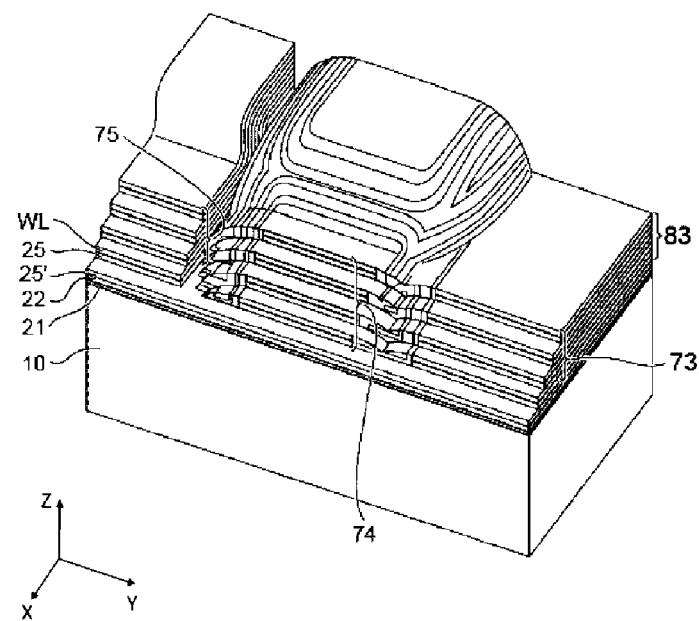
FIG. 27 is a diagram illustrating a result of a step of a method for manufacturing the contact regions of the semiconductor device according to the third embodiment.

Next, a third resist film R3 is formed over the entirety of the insulating layers 25 and conductive layers WL from which the upper stacked body 85 will be defined, and is by a third patterning process, for example by a third photolithography process such that the third resist film R3 remains on the insulating layers 25 and conductive layer WL from which the upper stacked body 85 will be formed on the region B, and the side of the patterned resist facing the second stacked body 84 is spaced from the second stacked body 84 by at least the film thickness "d" as illustrated in FIG. 26. Then, using the third resist film R3 as a mask, the insulating layers 25 and conductive layers 22 are etched to define the upper stacked body 85 as shown in FIG. 26.

Figure 28:
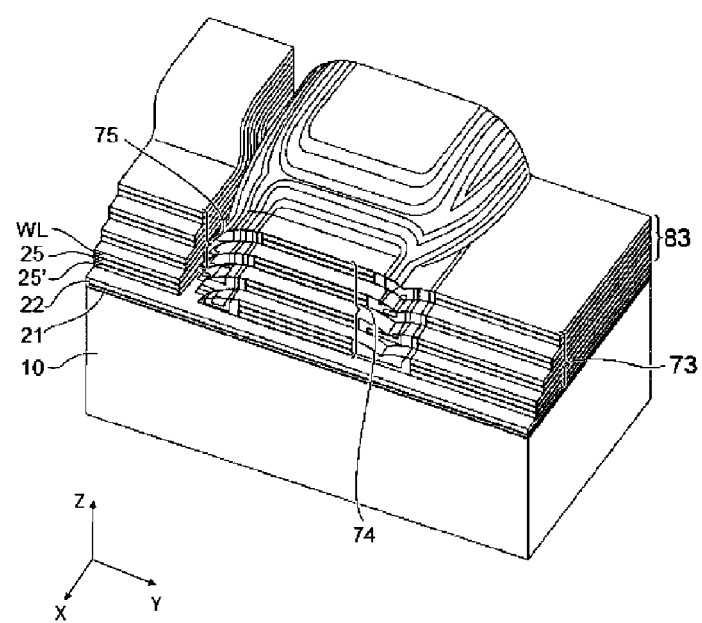
FIG. 28 is a diagram illustrating a result of a step of a method for manufacturing the contact regions of the semiconductor device according to the third embodiment.

Next, as in the second embodiment, the first, second, and third stair structure portions 73, 74, and 75 at the end portions of the respective stacked bodies are formed (FIG. 27), such that respective lowermost conductive portions steps of the first, second, and third stair structure portions 73, 74, and 75 are exposed from above (FIG. 28).

Figure 29:
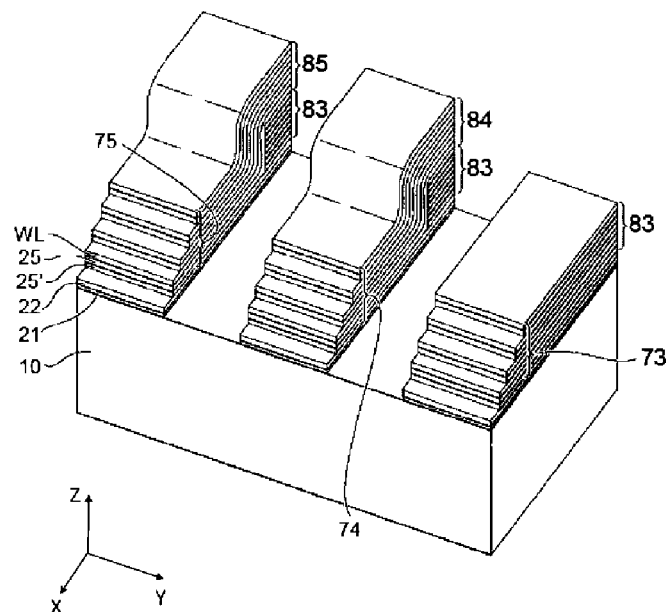
FIG. 29 is a diagram illustrating a result of a step of a method for manufacturing the contact regions of the semiconductor device according to the third embodiment.

Thereafter, residual film of the insulating layers 25 and conductive layers 22 which were etched to define the upper stacked body 85 are removed, yielding the structure illustrated in FIG. 29. Finally, as in the second embodiment, the interlayer insulating film 60 is formed on the entire surface, and contact holes 50 are formed therein in such a way as to connect to the exposed conductive layers 22 and WL to the upper layer wiring, to allow the contact electrodes 55 to be formed therein (not illustrated).

In the above-described way, the contact region 9 of the semiconductor device according to the third embodiment is completed.

Figure 30:
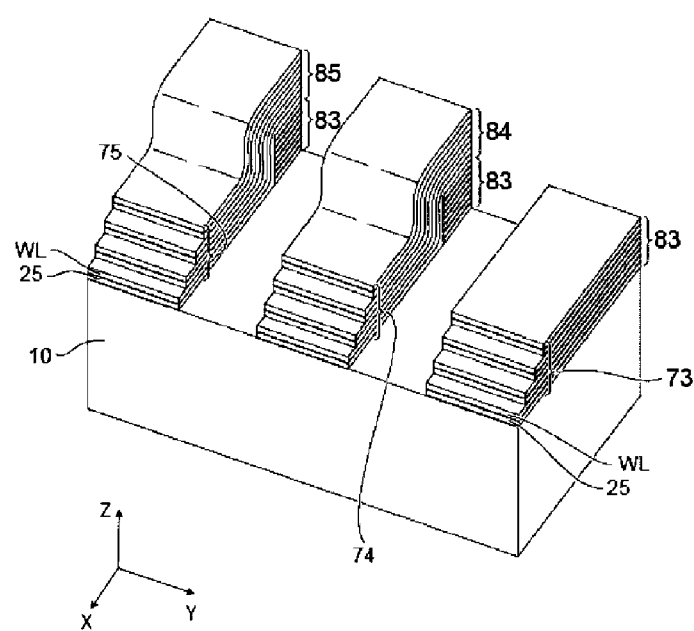
FIG. 30 is a diagram illustrating the contact regions of the semiconductor device according to the third embodiment.

Furthermore, as illustrated in FIG. 30, as in the second embodiment, in consideration of, for example, the number of conductive layers (SGS) 22 and the thickness of the entire stacked body, it is possible to include the insulating layer 21 and the conductive layer (SGS) 22 in the lower stacked body 83. In this case, since the number of processes is decreased, the contact region 9 is able to be easily formed.

Figure 31:
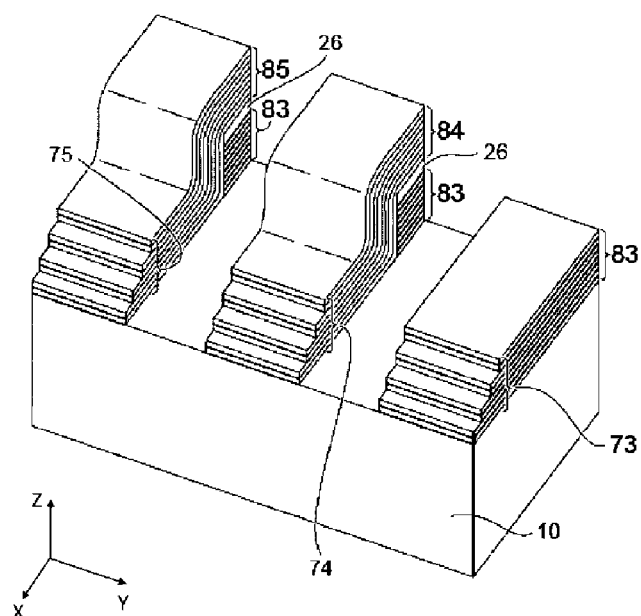
FIG. 31 is a diagram illustrating the contact regions of the semiconductor device according to the third embodiment.

Moreover, it is possible to form the stacked body of a contact region adapted for the memory cell region having the structure described in the modification example of the first embodiment. In this case, as illustrated in FIG. 31, a stop layer 26, which includes, for example, a silicon oxide film, is only formed between the lower stacked body 83 and the middle stacked body 84 and between the lower stacked body 83 and the upper stacked body 85. The stop layer 26 can also be made from alumina or hafnium oxide.

In the semiconductor device according to the present embodiment, since stair structure portions in the contact region are formed at three positions rather than two stair structures at two positions, the difference in height between the uppermost step and the lowermost step of the stair structures of each stacked body is smaller than in the second embodiment, if the same total number of stairs are present. Therefore, the formation of contact electrodes is facilitated because the differences in the depth of the contact holes etched through the interlayer insulating film is reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a first stacked unit including first electrode layers, first insulating layers, and an intermediate insulating layer, the first electrode layers and the first insulating layers being alternately stacked in a first direction crossing a surface of the substrate, the intermediate insulating layer being provided between the substrate and the alternately-stacked layers of the first electrode layers and the first insulating layers;
a first semiconductor column extending through the first stacked unit in the first direction, the first semiconductor column having a first diameter at a first level corresponding to one of the first electrode layers and a second diameter at a second level corresponding to the intermediate insulating layer, the second diameter being larger than the first diameter;
a first memory portion formed between the first semiconductor column and one of the first electrode layers;
a second stacked unit formed between the first stacked unit and the substrate, and including second electrode layers, second insulating layers, and a bottom insulating layer, the second electrode layers and the second insulating layers being alternately stacked in the first direction, the bottom insulating layer being provided between the substrate and the alternately-stacked layers of the second electrode layers and the second insulating layers;

a second semiconductor column extending through the second stacked unit in the first direction, the second semiconductor column having a third diameter at a third level corresponding to one of the second electrode layers and a fourth diameter at a fourth level corresponding to the bottom insulating layer, the fourth diameter being larger than the third diameter; and a second memory portion formed between the second semiconductor column and one of the second electrode layers, wherein the first semiconductor column has a first curved surface protruding toward the intermediate insulating layer and the second semiconductor column has a second curved surface protruding toward the bottom insulating layer, the second diameter is a maximum diameter of the first semiconductor column at the first curved surface, and the fourth diameter is a maximum diameter of the second semiconductor column at the second curved surface, and a ratio of the second diameter divided by a length of the first curved surface in the first direction is less than a ratio of the fourth diameter divided by a length of the second curved surface in the first direction.

2. The semiconductor memory device according to claim 1, wherein the intermediate insulating layer is formed of aluminum oxide.

3. The semiconductor memory device according to claim 2, wherein the bottom insulating layer is formed of aluminum oxide.

4. The semiconductor memory device according to claim 1, wherein the first semiconductor column is integrally formed with the second semiconductor column.

5. The semiconductor memory device according to claim 4, wherein a center of the first semiconductor column in a surface direction of the substrate is at a location different from a location of a center of the second semiconductor column in the surface direction of the substrate.

6. The semiconductor memory device according to claim 4, wherein the second diameter is larger than the third diameter.

7. A semiconductor memory device comprising:

a substrate;

a first stacked unit including first electrode layers, first insulating layers, and an intermediate insulating layer, the first electrode layers and the first insulating layers being alternately stacked in a first direction crossing a surface of the substrate, the intermediate insulating layer being provided between the substrate and the alternately-stacked layers of the first electrode layers and the first insulating layers;

a first semiconductor column extending through the first stacked unit in the first direction, the first semiconductor column having a first diameter at a first level corresponding to one of the first electrode layers and a second diameter at a second level corresponding to the intermediate insulating layer, the second diameter being larger than the first diameter;

a first memory portion formed between the first semiconductor column and one of the first electrode layers;

a second stacked unit formed between the first stacked unit and the substrate and including second electrode layers, second insulating layers, and a bottom insulating layer, the second electrode layers and the second insulating layers being alternately stacked in the first direction, the bottom insulating layer being provided between the substrate and the alternately-stacked layers of the second electrode layers and the second insulating layers;

a second semiconductor column extending through the second stacked unit in the first direction, the second semiconductor column having a third diameter at a third level corresponding to one of the second electrode layers and a fourth diameter at a fourth level corresponding to the bottom insulating layer, the fourth diameter being larger than the third diameter; and a second memory portion formed between the second semiconductor column and one of the second electrode layers, wherein the first semiconductor column has a first curved surface protruding toward the intermediate insulating layer and the second semiconductor column has a second curved surface protruding toward the bottom insulating layer, the second diameter is a maximum diameter of the first semiconductor column at the first curved surface, and the fourth diameter is a maximum diameter of the second semiconductor column at the second curved surface, and a length of the fourth diameter is greater than a length of the second curved surface in the first direction.

8. The semiconductor memory device according to claim 7, wherein the intermediate insulating layer is formed of aluminum oxide.

9. The semiconductor memory device according to claim 7, wherein the bottom insulating layer is formed of aluminum oxide.

10. The semiconductor memory device according to claim 7, wherein the first semiconductor column and the second semiconductor column are electrically connected to each other.

11. The semiconductor memory device according to claim 7, wherein the first semiconductor column is integrally formed with the second semiconductor column.

12. The semiconductor memory device according to claim 11, wherein a center of the first semiconductor column in a surface direction of the substrate is at a location different from a location of a center of the second semiconductor column in the surface direction of the substrate.

* * * * *